United States Patent
Kunimune et al.

(10) Patent No.: US 7,687,918 B2
(45) Date of Patent: Mar. 30, 2010

(54) SEMICONDUCTOR DEVICE AND METHOD FOR MANUFACTURING SAME

(75) Inventors: Yorinobu Kunimune, Kanagawa (JP); Mieko Hasegawa, Kanagawa (JP); Takamasa Itou, Kanagawa (JP); Takeshi Takeda, Kanagawa (JP); Hidemitsu Aoki, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 516 days.

(21) Appl. No.: 10/740,813

(22) Filed: Dec. 22, 2003

(65) Prior Publication Data

US 2004/0130030 A1   Jul. 8, 2004

(30) Foreign Application Priority Data

Dec. 27, 2002  (JP)  ............... 2002-379278

(51) Int. Cl.
*H01L 23/48* (2006.01)
(52) U.S. Cl. ............... 257/774; 257/758; 257/762
(58) Field of Classification Search ............... 257/758, 257/762, 774, 750
See application file for complete search history.

(56) References Cited

U.S. PATENT DOCUMENTS

| | | | | |
|---|---|---|---|---|
| 6,063,506 | A * | 5/2000 | Andricacos et al. | 428/546 |
| 6,334,249 | B2 * | 1/2002 | Hsu | 29/852 |
| 6,429,122 | B2 * | 8/2002 | Chooi et al. | 438/637 |
| 6,437,421 | B1 * | 8/2002 | Thiel et al. | 257/592 |
| 6,656,834 | B1 * | 12/2003 | Besser et al. | 438/629 |

FOREIGN PATENT DOCUMENTS

| | | |
|---|---|---|
| JP | 9-321045 | 12/1997 |
| JP | 11-186273 | 7/1999 |
| JP | 11-204524 | 7/1999 |
| JP | 11-330023 | 11/1999 |
| JP | 2000-031089 | 1/2000 |
| JP | 2003-347299 | 12/2003 |

OTHER PUBLICATIONS

Japanese Office Action dated Oct. 30, 2007 with a partial English language translation.
Reza Abbaschian, "Physical Metallurgy Principles", 3rd ed., PWS Publishing Company, pp. 272-279, publication date: 1991.

* cited by examiner

*Primary Examiner*—Leonardo Andújar
(74) *Attorney, Agent, or Firm*—McGinn I.P. Law Group, PLLC

(57) ABSTRACT

The present invention provides a semiconductor device comprising a metal interconnect having considerably improved electromigration resistance and/or stress migration resistance. The copper interconnect 107 comprises a silicon-lower concentration region 104 and a silicon solid solution layer 106 disposed thereon. The silicon solid solution layer 106 has a structure, in which silicon atoms are introduced within the crystal lattice structure that constitutes the copper interconnect 107 to be disposed within the lattice as inter-lattice point atoms or substituted atoms. The silicon solid solution layer 106 has the structure, in which the crystal lattice structure of copper (face centered cubic lattice; lattice constant is 3.6 angstrom) remains, while silicon atoms are introduced as inter-lattice point atoms or substituted atoms.

15 Claims, 21 Drawing Sheets

(a)

(b)

(a)

(b)

(a)

(b)

(c)

(d)

(j)

(k)

(e)

(f)

(g)

(k)

(l)

BULK Cu LAYER

LAYER HAVING HIGHER CONCENTRATION
NEAR THE SURFACE

Cu SILICIDE

SEMICONDUCTOR DEVICE AND METHOD FOR MANUFACTURING SAME

This application is based on Japanese patent application NO. 2002-379278, the content of which is incorporated hereinto by reference.

1. FIELD OF THE INVENTION

The present invention relates to a semiconductor device comprising a metal interconnect, and a method for manufacturing same.

2. DESCRIPTION OF THE RELATED ART

In recent years, for the purpose of satisfying the increasing requirements for obtaining higher level of the integration of semiconductor devices, copper becomes to be widely employed for material of interconnects or plugs. Copper is a material, which is characterized in having lower resistance and better electromigration resistance than that of aluminum that has been conventionally employed.

On the contrary, the generation of electromigration becomes a problem even in the application of interconnects made of copper, as the reduction of the semiconductor devices is further proceeds. The copper film that constitutes the copper interconnect is generally formed by the electroplating method or the like, and the formed copper film by such method has a morphology, in which a number of copper particles having polycrystalline structure are aggregated. When an electrical voltage is applied to the copper interconnect having such configuration, mass transfer is occurred through the grain boundaries of the copper particles, resulting in causing the electromigration. Since the interconnect having smaller line width includes smaller grain sizes of the copper particles, the problem of the electromigration due to the mass transfer through the particle boundaries becomes more serious. The resistance to the electromigration is closely related to the lifetime of the devices, and devices having poor electromigration resistance tend to have shorter lifetime.

On the other hand, a problem of generation of the stress migration occurred in the copper interconnect structure attracts attention in recent years. FIGS. 1(a) and 1(b) are schematic cross sectional views of a multi-layer copper interconnect formed by a damascene method. The multi-layer copper interconnect has a structure, in which an upper layer interconnect 121b is coupled to an upper surface of an underlying layer interconnect 121a, and the upper layer interconnect 121b comprises a coupling plug and an interconnect formed on the upper surface thereof. In FIG. 1(a), a void 122 is generated at the side of the upper interconnect 121b. That is, the void is created in a portion of the via that constitutes the upper interconnect 121b. On the contrary, in the case shown in FIG. 1(b), a void 122 is generated on the upper surface of the lower interconnect 121a. It is considered that such voids 122 are generated because an internal stress is created within the copper interconnect due to the thermal history or the like in the semiconductor process. In the case of FIG. 1(a), it is considered that an "up drawing" of the copper occurs within the upper interconnect 121b, and copper migrates toward the upper direction within the via to generate the void 122. Meanwhile, in the case of FIG. 1(b), it is considered that copper migrates within the lower interconnect 121a in the horizontal direction, resulting in formation of the void 122. Such phenomena of the mass transfer of copper due to the stress are referred to as a stress migration. The generation of such void causes an insufficient coupling between the coupling plug and the interconnect, reducing the process yield of the semiconductor device, or destabilizing the operation of the semiconductor device in the long term operation.

JP-A-H11-204,524 (1999) discloses a technology of improving the electromigration resistance by introducing a different element such as Mg, Zr, Sn or the like in the copper interconnect to form a copper alloy therein. However, the technology disclosed in JP-A-H11-204,524 has problems of the increase in the electrical conductivity of the copper interconnect or the like. In addition, it is difficult to improve the stress migration by this technology, even though this technology is useful in improving the electromigration at certain level.

Meanwhile, a technology of forming a copper silicide layer on the upper side of the copper interconnect is conventionally known as a technology for suppressing the generation of the stress migration. JP-A-H9-321,045 (1997) discloses a technology of forming Cu silicide layer on the upper side of the copper interconnect for the purpose of improving the stress migration resistance or the like. However, it is still difficult to completely prevent the stress migration even in employing the constitution of forming the silicide layer thereon.

In view of the above situation, the present invention provides a solution to the above-mentioned problems, and it is an object of the present invention to provide a semiconductor device comprising a metal interconnect having considerably improved electromigration resistance and/or stress migration resistance in comparison with the conventional semiconductor devices.

It is further object of the present invention to provide a method for manufacturing such semiconductor device with certain process stability.

SUMMARY OF THE INVENTION

According to the present invention, there is provided a semiconductor device comprising: a semiconductor substrate; an insulating film formed on the semiconductor substrate; and a metal interconnect embedded in the insulating film, wherein the metal interconnect contains atoms of a solid solution element.

The semiconductor device comprises the metal interconnect containing the solid solution element. Here, the term "solid solution" means a state of a solid, in which two materials are dissolved each other in the solid state, and the solid solution does not include inter-metal compounds that typically includes silicide compounds such as copper silicide. The "solid solution" can be generally classified into two types: a substitution type and a penetration type. The substitution type solid solution represents a state of the solid solution, in which atoms of the lattice constituting the crystal are substituted with atoms of different elements. The penetration type solid solution represents a state of the solid solution, in which atoms of other elements are disposed between some of the lattice points that constitute the crystal.

The metal interconnect according to the present invention comprises a configuration of containing solid solution element atoms. This configuration realizes improved electromigration resistance and improved stress migration resistance.

Meanwhile, the configuration, in which silicide is formed on the surface of the copper interconnect, is described in the foregoing Description of the Prior Art, and the configuration corresponds to the above-mentioned inter-metal compound. The configuration of being provided with the silicide may not provide sufficient stress migration resistance, as described later.

According to the present invention, there is provided a method for manufacturing a semiconductor device, comprising: forming an insulating film on a semiconductor substrate; forming a metal interconnect on the insulating film; and introducing atoms of solid solution element into the metal interconnect by exposing the metal interconnect with a gas containing atoms of a different element from a metal element constituting the metal interconnect.

The method according to the present invention provides the method for manufacturing of the semiconductor device having improved electromigration resistance and the stress migration resistance with higher process stability.

The method according to the present invention may further comprise: forming a layer of an oxide of the metal element constituting the metal interconnect on top of the metal interconnect after the step of forming the metal interconnect; and thereafter introducing atoms of solid solution element into the metal interconnect by exposing a surface of the layer of oxide of the metal element with the gas. In addition, the step of forming the layer of oxide of the metal element may comprise: cleaning the surface of the metal interconnect with an organic acid; and performing a rinse processing with pure water. These configurations provide method for manufacturing semiconductor device having the above-mentioned performances with higher process stability.

Further, the method according to the present invention may further comprise: forming a film containing SiC, SiN, SiON or SiOC on the upper side of the metal interconnect after introducing atoms of solid solution element into the metal interconnect. The formation of the film containing these materials on the interconnect provides effectively suppressing the diffusion of the metal constituting the metal interconnect into the inter-layer insulating film while reducing the increase of the parasitic capacitance between the adjacent metal interconnect to a minimum degree.

The method according to the present invention may have a configuration, in which the metal element constituting the metal interconnect is a copper or an alloy containing copper. The solid solution element may have a suitable properties and a size, which are suitable for solid solution element atom to be introduced into metal crystal constituting the metal interconnect in a form of the substitution type or the penetration type. When the metal interconnect is made of copper or an alloy containing copper, the atomic radius of atom of the solid solution element may preferably be not larger than 1.4 angstrom. By selecting such atomic size, the solid solution having improved stress migration resistance is realized with higher process stability.

Exemplary elements of the solid solution atoms may be: Si; Al; Be; Zn; Au; Ga; Mg; Ni; Pd; Pt or the like. Among these, Si; Al; Be; Zn; Au; Ga; Mg; Ni; and Pd are preferably employed in view of being capable of providing further improved stress migration resistance, and further, Si; Al; Be; and Zn are more preferably employed in view of providing higher stress migration resistance with higher process stability and higher process yield. The present invention has a configuration, in which atoms of these elements are introduced into the metal interconnect as solid solution element atoms. In order to obtain such metal interconnects with higher process stability, it is critical that the element atoms should be introduced therein without causing chemical reaction of the introduced element atoms with the metal element atoms constituting the metal interconnect to form inter-metal compounds. More specifically, the type of elements, the conditions for introducing the element atoms, the control of the surface conditions of the metal interconnect to be introduced therewith or the like may be suitably selected to achieve the preferable solid solution conditions with higher stability.

In view of stably achieving the solid solution state with improved stress migration resistance, it is preferable that elements of the solid solution elements are selected from a group in the periodic table that is different from a group to which metal element constituting the metal interconnect belongs.

It is preferable that solid solution element atoms are introduced into a region of the metal interconnect in vicinity of the surface thereof. The region of the metal interconnect, in which solid solution element atoms are introduced, may form a solid solution layer in vicinity of the surface of the metal interconnect.

The concentration of the solid solution element atoms in the solid solution layer may preferably be within a solid solution range for the metal element constituting the metal interconnect. For example, when silicon is introduced into the copper interconnect, the preferable range may be from 0.1 atomic % to 9 atomic %. Having this configuration, considerable improvements in the electromigration resistance and the stress migration resistance can be achieved.

The concentration of the solid solution element atoms in other portions of the metal interconnect than the portion of the solid solution layer may preferably be less than 0.1 atomic %. The thickness of the solid layer within the metal interconnect may be equal to or lower than 40% of the thickness of the metal interconnect. By selecting this configuration, the electromigration resistance and the stress migration resistance can be improved while suppressing the increase of the line resistance.

DESCRIPTION OF THE PREFERRED EMBODIMENTS

First Preferred Embodiment

Figure 1:
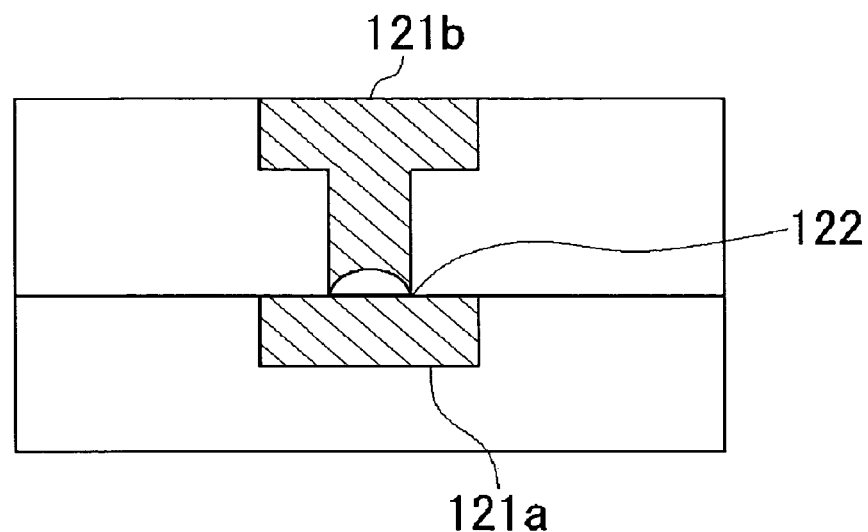
FIGS. 1(*a*) and 1(*b*) are schematic diagrams of a multi-layer copper interconnect, showing the situation of occurring of the stress migration.
Figure 1:
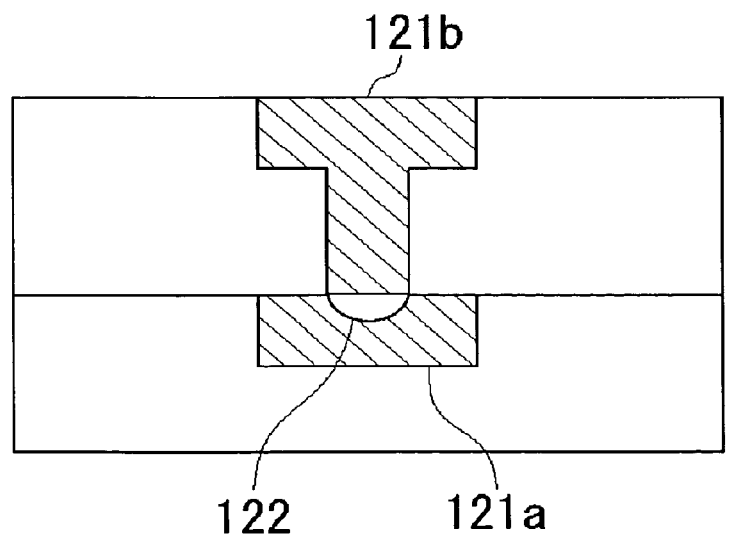
Figure 2:
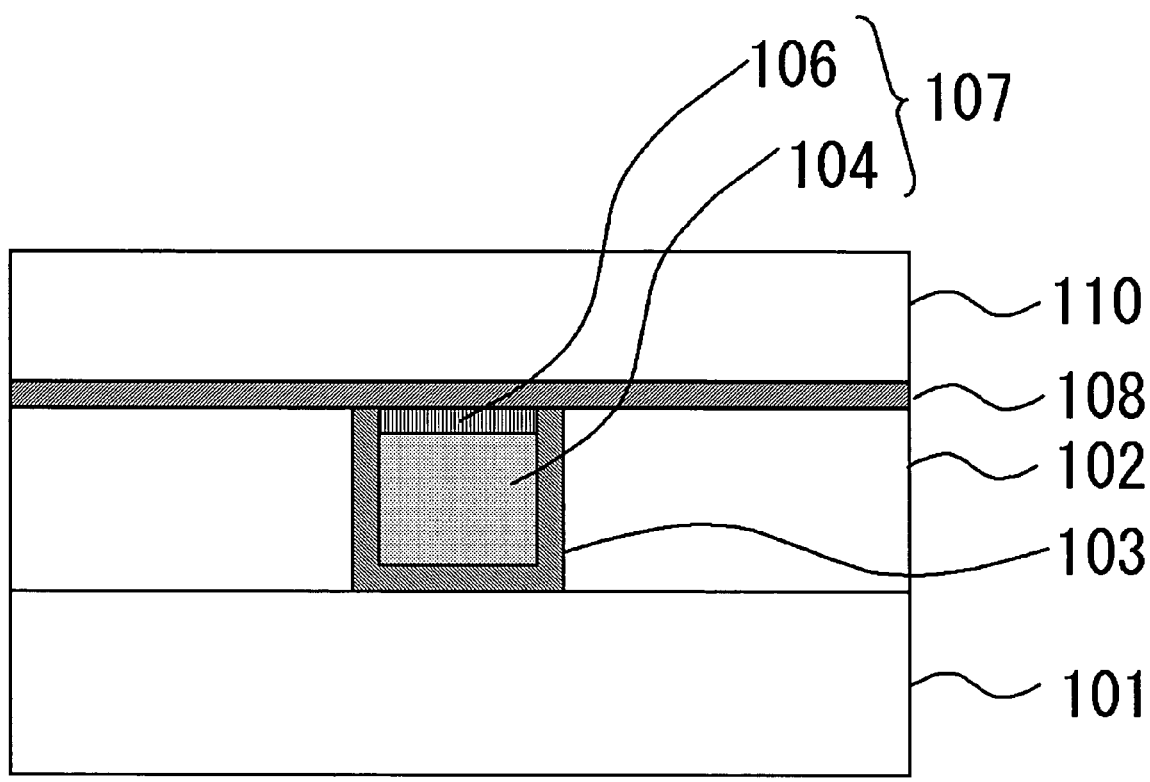
FIG. 2 is a cross sectional view of a semiconductor device according to a first preferred embodiment of the present invention.

FIG. 2 is a cross sectional view of a semiconductor device according to a first embodiment of the present invention, showing the structure of the semiconductor device. The semiconductor device has a structure, which comprises an insulating film 101 deposited on a silicon substrate that is not shown and an insulating film 102 deposited on said insulating film 101, and a copper interconnect 107 is disposed in a groove formed in the insulating film 102. Side surfaces and bottom surface of the copper interconnect 107 are covered with a barrier metal film 103. Upper surface of the copper interconnect 107 are covered with a diffusion barrier film 108, and further, an inter-layer insulating film 110 is deposited thereon.

Figure 3:
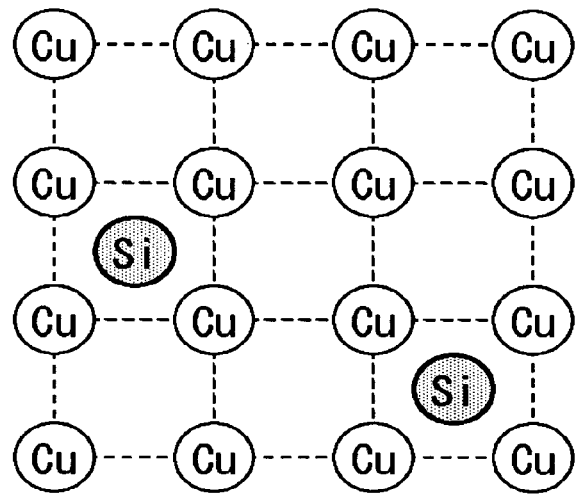
FIG. 3(*a*) is a schematic diagram showing a crystalline structure of silicon solid solution layer, and FIG. 3(*b*) is a schematic diagram showing a structure of copper silicide. Both figures indicate the difference between the crystal structure of silicon solid solution layer and that of copper silicide.
Figure 3:
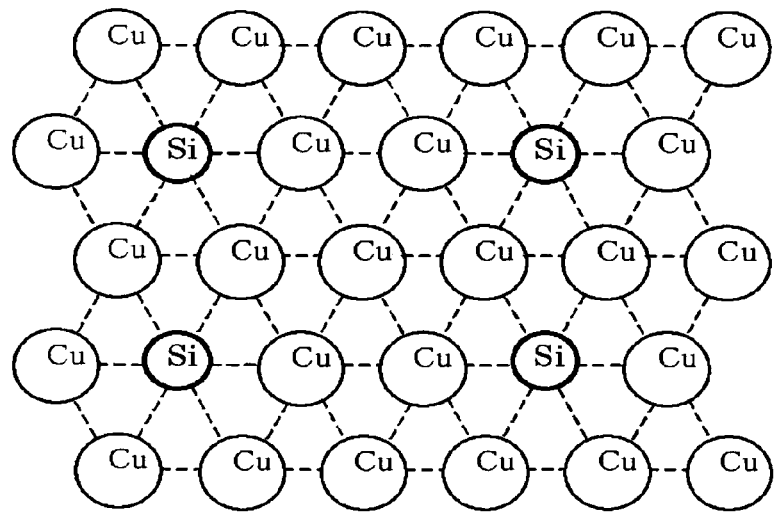

The copper interconnect 107 comprises a lower-silicon concentration region 104 and a silicon solid solution layer 106 disposed thereon. The silicon solid solution layer 106 has a structure, in which silicon atoms are introduced within the crystal lattice structure of copper that constitutes the copper interconnect to be disposed within the lattice as inter-lattice point atoms or substituted atoms. Concerning this aspect, this structure is essentially different from the structure of silicide, which is formed by reacting copper with silicon to form the inter-metal compound. It is considered that silicon-containing copper constituting the silicon solid solution layer 106 has a structure shown in FIG. 3(a). That is, the silicon solid solution layer 106 has the structure, in which the crystal lattice structure of copper (face centered cubic lattice; lattice constant is 3.6 angstrom) remains, while silicon atoms are introduced as inter-lattice point atoms or substituted atoms. On the other hand, FIG. 3(b) schematically shows a structure of copper silicide. Copper silicide has a structure, in which, unlike the silicon solid solution layer, the crystal lattice structure of copper does not remain and both copper atoms and silicon atoms form the crystal lattice. Incidentally, the crystal lattice structure of copper silicide is: beta —Mn structure, and lattice constant thereof is 6.2 angstrom. Data for indicating the difference between these structures will be shown later in the description of the EXAMPLES.

This embodiment provides that lower resistance of the interconnect is achieved by having the lower-silicon concentration region 104 and the stress migration resistance and the electromigration resistance are considerably improved by having the silicon solid solution layer 106 having the above described structure.

In order to obtain silicon-containing copper having the structure described above with higher stability, it is effective to employ a method of exposing a copper oxide film formed on the copper film to monosilane. Although reasons that the solid solution layer which is intended in the present invention can be achieved stably according to this method is not necessarily clarified, it is expected that rapid reaction of copper and silicon is suppressed du to an interposition of the copper oxide film therebetween, thereby preventing the formation of copper silicide. In the above-mentioned method, a multi-layer structure having a copper layer, a copper oxide layer deposited thereon and a silicon compound layer deposited thereon is once formed. Thereafter, thermal processing is performed to diffuse copper atoms into the silicon compound layer, thereby forming the silicon-containing copper layer. It is considered that this phenomenon occurs because the rate of the diffusion of copper atoms into the silicon compound is higher than the rate of the diffusion of silicon atoms into copper. It is further considered that such manner of the diffusions contributes the formation of the silicon solid solution layer. On the contrary, when fresh and bare copper is exposed to monosilane, copper silicide is apt to be formed. Because in this case silicon deposited on the surface of the copper rapidly reacts with copper to form copper silicide.

Figure 4:
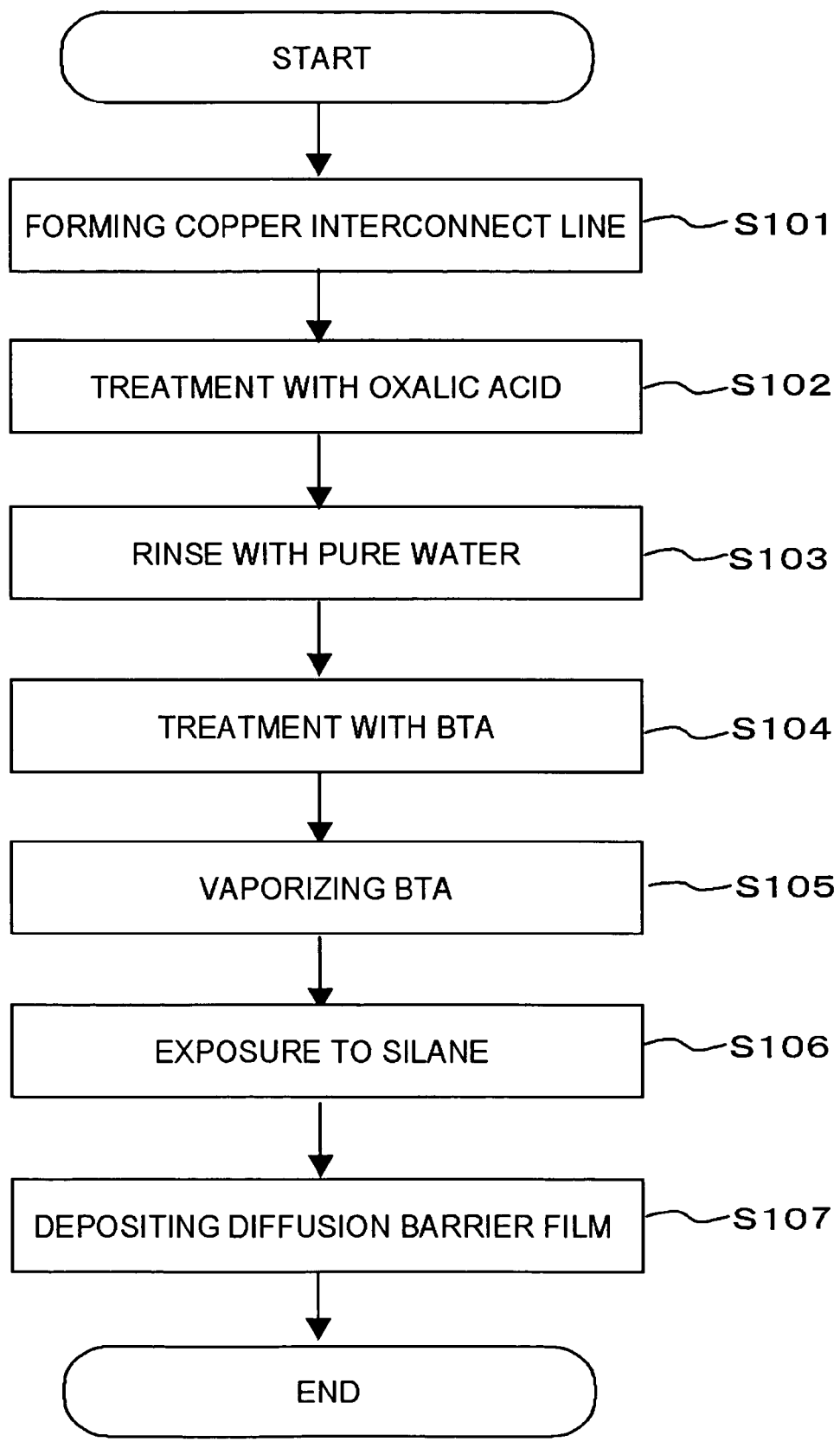
FIG. 4 is a flow chart showing a process for forming the copper interconnect according to the first preferred embodiment of the present invention.

FIG. 4 is a flow chart showing processing steps for forming the above-mentioned silicon solid solution layer with higher stability. First, a copper interconnect is formed via a damascene process (S101). Next, an oxide layer on the copper surface is removed by using oxalic acid aqueous solution (S102).

Thereafter, a rinse processing with pure water is performed to remove the residual oxalic acid and other impurities (S103).

Subsequently, anticorrosives such as a solution containing azole compounds such as benzotriazole (BTA) or the like, for example, may be used to conduct an anticorrosion processing (S104). BTA is employed in this embodiment. BTA adheres onto the copper surface by performing this processing, thereby suppressing the oxidization of copper.

Next, the processed substrate is transferred to a deposition chamber, and thereafter the deposition chamber is evacuated to create a vacuum atmosphere, thereby vaporizing BTA (S105). Thereafter, the copper interconnect is exposed to silane (S106). The exposure to silane may be carried out by a method of, for example, exposing the copper interconnect to monosilane (SiH4) or the like. Silicon atoms are introduced into the copper interconnect by performing the exposure processing. After that, a diffusion barrier film such as SiCN or the like is deposited thereon via CVD (S107).

In the above-mentioned process, by optimizing the conditions of the silane exposure processing in the step 106 the silicon solid solution layer. More specifically, the silane exposure may be performed while maintaining the status of remaining the thin oxide layer on the copper surface, and the flow rate of silane raw material gas may be controlled to be within an optimized range so as not to be excessive level. Concerning the control of the thickness of the oxide layer, by adjusting the process conditions in the step 102 and step 103 a suitable thickness of the oxide layer can be preferably controlled.

In order to forming the solid solution layer with improved process stability, the relationship of the crystal lattice constant of the metal constituting the interconnect and the atomic radius of the different element atoms for being introduced is also critical. Excessively larger atomic radius relative to the lattice constant may lead to a difficulty in forming the preferable solid solution layer that preferably meets the object of the present invention, resulting in achieving insufficient improvements in the electromigration resistance and in the stress migration resistance. When copper is selected as the interconnect metal, the atomic radius of the different element atoms for introduced may preferably be equal to or less than 1.4 angstrom, in consideration of the lattice constant of copper (face centered cubic lattice; lattice constant is 3.6 angstrom). The penetration type solid solution layer can be formed with relatively higher process stability by selecting the different element having such atomic radius.

Second Preferred Embodiment

FIGS. 5(a) to 5(e) are cross sectional views of the semiconductor devices, showing the processing steps of the process for manufacturing a semiconductor device according to the second embodiment of the present invention. An underlying insulating film 101 and a SiO2 insulating film 102 having a thickness of 500 nm are deposited on a semiconductor substrate (not shown) that includes semiconductor devices such as transistors formed thereon, and thereafter a pattern for a groove interconnect is formed on the SiO2 insulating film 102 via dry etching processing (FIG. 5(a)).

Figure 5:
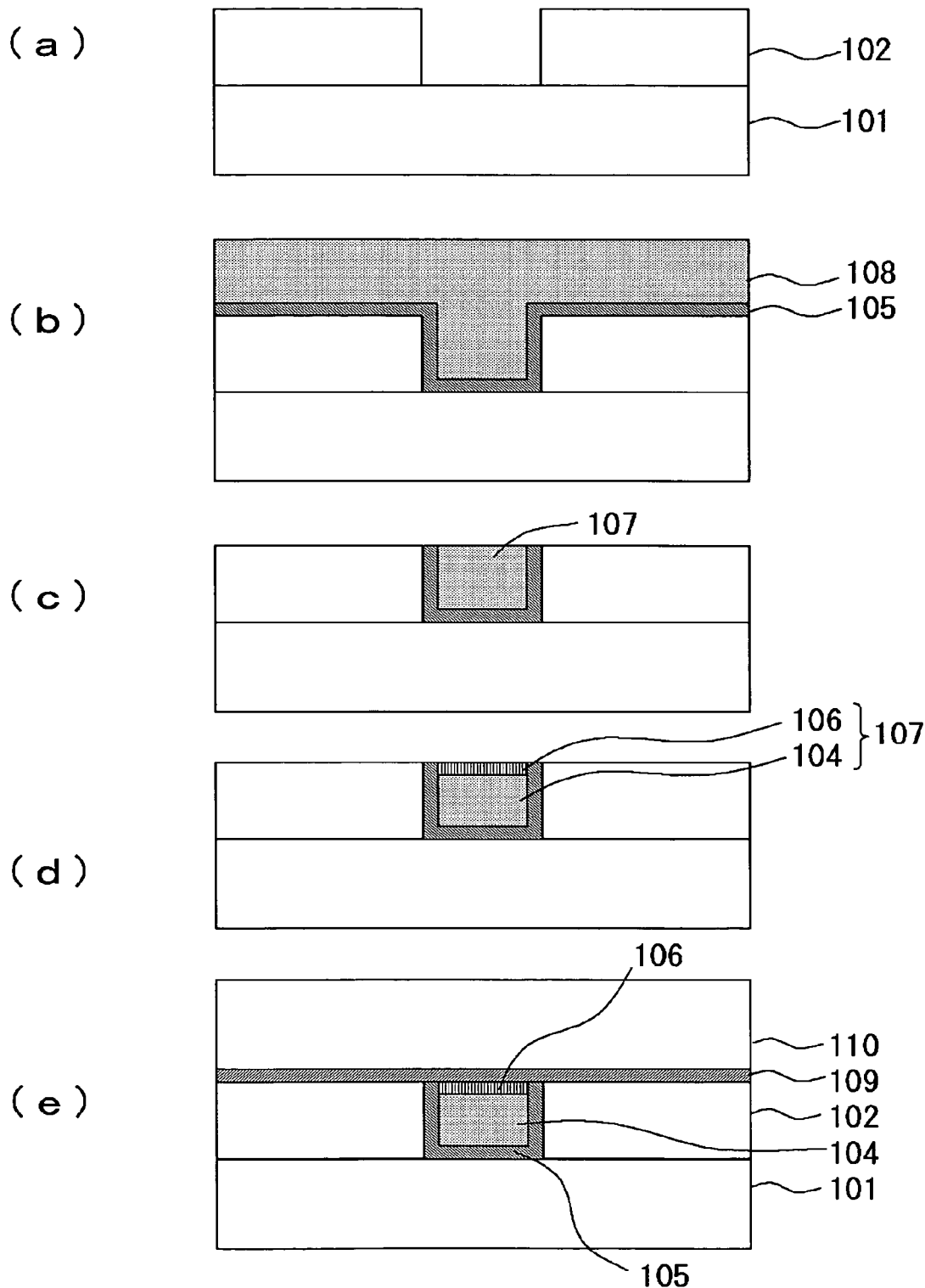
FIGS. 5(*a*) to 5(*e*) are cross sectional views of the semiconductor devices, showing the processing steps of the process for forming the copper interconnect according to a second preferred embodiment of the present invention.

Then, as shown in FIG. 5(b), a barrier metal of Ta/TaN films 105 (films having a Ta film and a TaN film disposed thereon) is deposited to a thickness of 30 nm on the exposed underlying insulating film 101 and SiO2 insulating film 102. Then, a Cu layer 108 is formed via an electrolytic plating so as to fill the pattern for the groove interconnect therewith.

Next, as shown in FIG. 5(c), the portion of the Cu layer 108 and the Ta/TaN films 105 outside of the groove portion are removed via CMP (chemical mechanical polishing) to form a Cu interconnect 107. The surface of the Cu interconnect 107 is cleaned with oxalic acid aqueous solution to remove the oxide layer on the copper surface. Thereafter, a rinse processing with pure water is performed to remove the residual oxalic acid and other impurities. Subsequently, the surface of the copper interconnect is treated with BTA aqueous solution. The anticorrosive of BTA adheres onto the copper surface by performing this treatment.

Next, the treated substrate is transferred to a deposition chamber, and thereafter the deposition chamber is evacuated to create a vacuum atmosphere, thereby vaporizing BTA. At the time of completing this processing, a copper oxide thin film remains on the surface of the Cu interconnect 107. The copper oxide thin film has been formed during the above-mentioned rinse processing performed after the treatment with oxalic acid.

The copper interconnect is indirectly exposed to silane via the copper oxide thin film to form the silicon solid solution layer 106 on the top surface of the copper interconnect as shown in FIG. 5D. The exposure to silane is carried out by employing the method of exposing it to monosilane (SiH4). More specifically, the process conditions in the plasma CVD apparatus are as follows: flow rates of the process gas are 10 to 500 sccm of SiH4 gas, 100 to 1,000 sccm of N2 gas; process pressure is not higher than 20 Torr; and the process time is, for example, not longer than 150 seconds, although the process time depends on the flow rates of the respective process gases and the pressure within the processing chamber. By these conditions the silicon-containing layer on the top of the copper layer is formed.

Next, as shown in FIG. 5(e), a Cu diffusion barrier film of a SiCN film 109 having a thickness of 50 nm is deposited on the silicon solid solution layer 106 and the SiO2 insulating film 102. This deposition process may be carried out by a plasma CVD utilizing reaction gases containing SiH(CH3)3, NH3 and He within the above-mentioned plasma CVD apparatus.

Thereafter, a SiO2 inter-layer insulating film 110 having a thickness of 500 nm is deposited in the above-mentioned plasma CVD apparatus. Here, the interconnect structure of this embodiment can be obtained by the above described procedures.

Although SiH4 gas is employed for the raw material gas for the deposition of the silicon solid solution layer 106 in this embodiment, other inorganic silane gas or species such as Si2H6, SiH2 and SiH2Cl2 may be employed. The silane exposure processing may be carried out within an O2-free gas atmosphere at a processing temperature of 200 degree C. to 450 degree C. and at a processing pressure of not higher than 20 Torr.

It should also be noted that the adhesiveness with the overlying Cu diffusion barrier film is improved, since silicon is diffused within the silicon solid solution layer 106. Here, in order to further improve the adhesiveness with the Cu diffusion barrier film, silicon may preferably be mal-distributed in the upper side of the interconnect 107, and it is desired that the concentration of silicon is highest in the top portion of the interconnect.

The concentration of silicon in the silicon solid solution layer 106 may preferably be not less than 0.1 atomic %, and more preferably not less than 1 atomic %. By selecting this range of the concentration of silicon, considerable improvements in the electromigration resistance and the stress migration resistance can be achieved. The upper limit of the concentration of silicon is required to be within a range that provides the status, in which silicon is solid-soluble in the copper interconnect, and more specifically not higher than 9 atomic % for example, and more preferably not higher than 7 atomic %. By selecting this range of the concentration of silicon, solid solution compounds other than copper silicide can be obtainable with higher process stability. The thickness of the silicon solid solution layer 106 is preferable to be thinner to a certain degree in view of suppressing the increase in the electric resistance. For example, when the region of the copper interconnect having the silicon concentration of not less than 0.1 atomic % is defined as the silicon solid solution layer, by designing the silicon solid solution layer to be not greater than 40% of the thickness of the metal interconnect, and more preferably not greater than 20% thereof, the interconnect structure having a balanced performance that achieves improved electromigration resistance and stress migration resistance while maintaining better interconnect resistance and contact resistance can be obtained.

According to this embodiment, the semiconductor device comprising the metal interconnect having considerably improved electromigration resistance and stress migration resistance can be obtained.

Third Preferred Embodiment

Figure 6:
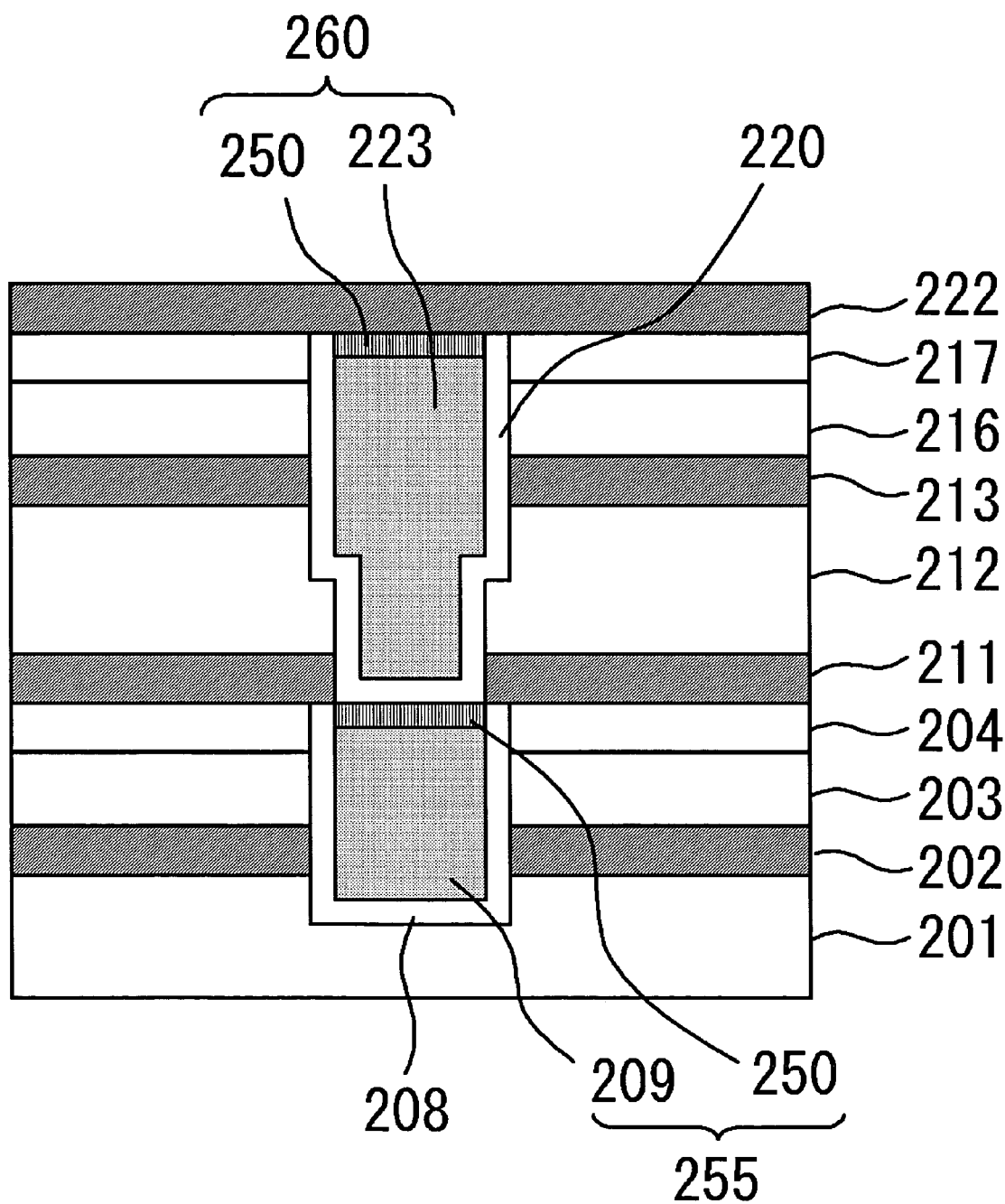
FIG. 6 is a cross sectional view of a semiconductor device according to a third preferred embodiment of the present invention.
Figure 7:
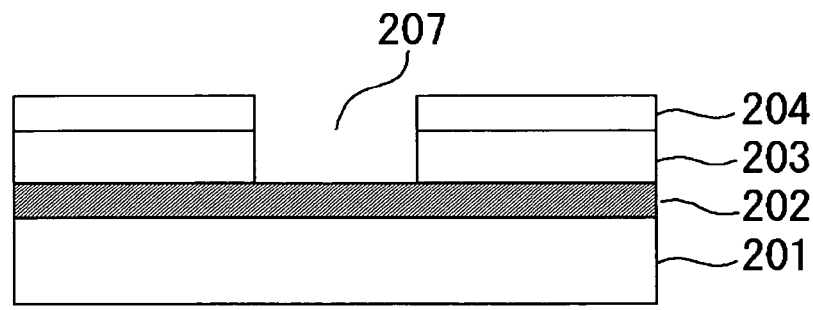
FIGS. 7(*a*) to 7(*d*), are cross sectional views of the semiconductor devices, showing the processing steps of the process for forming the copper interconnect according to the third preferred embodiment of the present invention.
Figure 7:
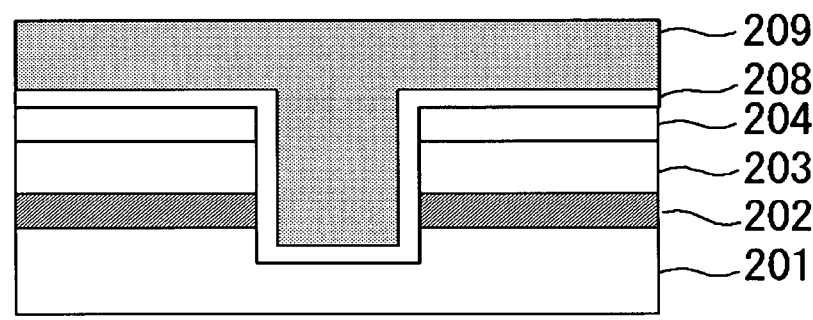
Figure 7:
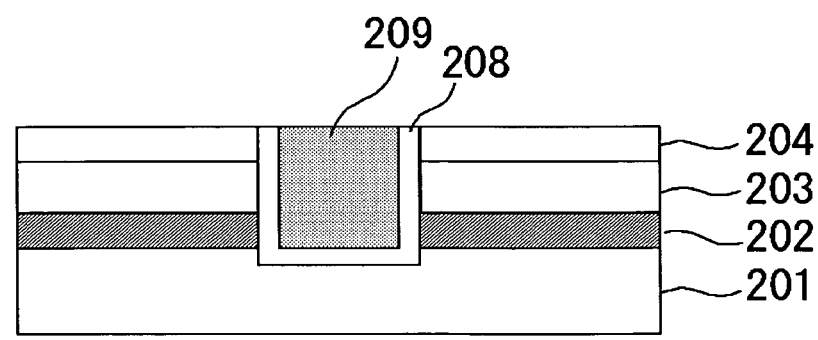
Figure 7:
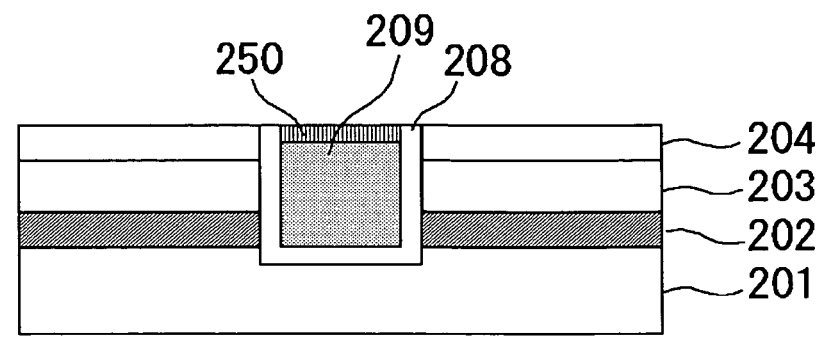

FIG. 6 is a cross sectional view of a semiconductor device according to a third embodiment of the present invention, showing the structure of the semiconductor device. The semiconductor device has a structure, in which an underlying layer interconnect 255 is coupled to an upper interconnect 260 through a via plug.

The underlying layer interconnect 255 is disposed within a groove formed in the shown multi-layer films. The groove is formed in the multi-layered films comprising an underlying insulating film 201 deposited on a semiconductor substrate (not shown), a SiCN film 202, a L-Ox (registered trademark of NEC Corporation, Tokyo Japan) film 203 that is ladder-shaped siloxane hydride, and a SiO2 film 204. Side surfaces and bottom surface of the underlying layer interconnect 255 are covered with Ta/TaN films 208. L-Ox film is a film of ladder-shaped siloxane hydride, which is referred to as "ladder oxide".

Here, ladder-shaped siloxane hydride is a polymer having a ladder-shaped molecular structure, and is preferably selected to have a dielectric constant of not higher than 2.9 in view of performing the line delay, and also preferably selected to have lower film density. For example, ladder-shaped siloxane hydride preferably has a film density within a range from 1.50 g/cm3 to 1.58 g/cm3 and a refractive index at 633 nm within a range from 1.38 to 1.40. An exemplary film material may be L-Ox or the like. An insulating material comprising porous L-Ox may also be employed.

The via plug is disposed in an aperture formed in multi-layer films comprising a SiCN film 211 disposed on the SiO2 film 204 and a SiO2 film 212. Sidewalls and bottom surface of the aperture are covered with Ta/TaN films 220, and filled with silicon-containing copper.

An upper layer interconnect 260 is disposed in a groove formed in multi-layer films. The groove is formed in the multi-layer films comprising the SiO2 film 212, a SiCN film 213, a L-Ox film 216 and a SiO2 film 217. Sidewalls of the upper layer interconnect 260 is covered with the Ta/TaN films 220, and the upper surface of the upper layer interconnect 260 has a SiCN film 222 formed thereon.

Next, the process for manufacturing the semiconductor device of this embodiment will be described.

FIGS. 7(a) to 7(d), FIGS. 8(e) and 8(f) F, FIGS. 9(g) to 9(i) and FIGS. 10(j) and 10(k) are cross sectional views of the semiconductor devices, showing the processing steps of the process for manufacturing a semiconductor device according to the third embodiment of the present invention. Here, the processing steps that are similar to the processing steps of the above-described embodiments will not be described in detail to avoid the duplicated descriptions.

In the process for manufacturing the semiconductor device according to the this embodiment, the SiCN film 202 is deposited as an etch stop film for forming a groove of a first groove interconnect to the thickness of 50 nm on the underlying insulating film 201 deposited on the substrate having semiconductor devices thereon via a plasma CVD. Then, a low dielectric constant inter-layer insulating film of the L-Ox film 203, which functions as an inter-layer insulating film for the first copper groove interconnect, is deposited thereon to a thickness of 300 nm via a spin on process, and the formed film is baked within N2 atmosphere at 400 degree C. for 30 minutes. Then, the SiO2 film 204 is deposited thereon to a thickness of 100 nm via the plasma CVD. Thereafter, the SiO2 film 204 and the L-Ox film 203 are dry-etched to form a first pattern for a groove interconnect 207. (FIG. 7(a))

Next, the SiCN film 202, which also functions as an etch stop film, is etched back via the dry etching processing, and then the electrical conductive surface thereof to an underlying semiconductor device is exposed, and a wet stripping processing for removing the etching residue is carried out to form the first pattern for groove interconnect 207. Then, a barrier metal layer of the Ta/TaN films 208 is deposited to a thickness of 30 nm via a sputtering, and subsequently a Cu film 209 is deposited on the Ta/TaN films 208 to a thickness of 100 nm via a sputtering. Thereafter, the Cu film 209 is further grown to a thickness of 700 nm via an electrolytic plating, and after filling the first pattern for groove interconnect 207, a thermal processing for crystallization thereof is carried out within N2 atmosphere at 400 degree C. for 30 minutes (FIG. 7(b)).

Next, the Cu film 209 and the Ta/TaN films 208 on the SiO2 film 204 are removed via a CMP, and after performing a treatment with oxalic acid and a rinse with pure water, a surface treatment with BTA solution is carried out. These processing steps provide the first copper groove interconnect, in which the Cu surface thereof is antioxidant-treated to form a BTA layer thereon (FIG. 7(c)).

Next, a thermal processing for removing the BTA layer on the first copper groove interconnect via thermal decomposition is performed within the plasma CVD apparatus at a temperature of 200 to 450 degree C., with a N2 gas flow rate of 100 to 1,000 sccm and at a processing pressure of not being higher than 20 Torr for about one minute. Further, after removing the BTA layer, a thermal processing of the first copper groove interconnect is performed with a SiH4 gas flow rate of 10 to 500 sccm and a N2 gas flow rate of 5,000 sccm and at a processing pressure of not being higher than 20 Torr for 240 seconds to form a silicon solid solution layer 250 (FIG. 7(d)).

Thereafter, a SiCN film 211 functioning as a Cu diffusion barrier film (film thickness of 50 nm), a SiO2 film 212 functioning as an inter-layer insulating film (film thickness of 400 nm), and a SiCN film 213 functioning as an etch stop film (film thickness of 50 nm) are sequentially deposited. A L-Ox film 216 functioning as an inter-layer insulating film for a second groove interconnect is spun on thereon to a thickness of 300 nm and baked, and then a SiO2 film 217 is deposited thereon to a thickness of 100 nm. Subsequently, an antireflection film 225 and a photo resist 214 are applied thereon, and a resist pattern 215 for vias is formed in the photo resist via a photolithography technique (FIG. 8(e)).

Figure 8:
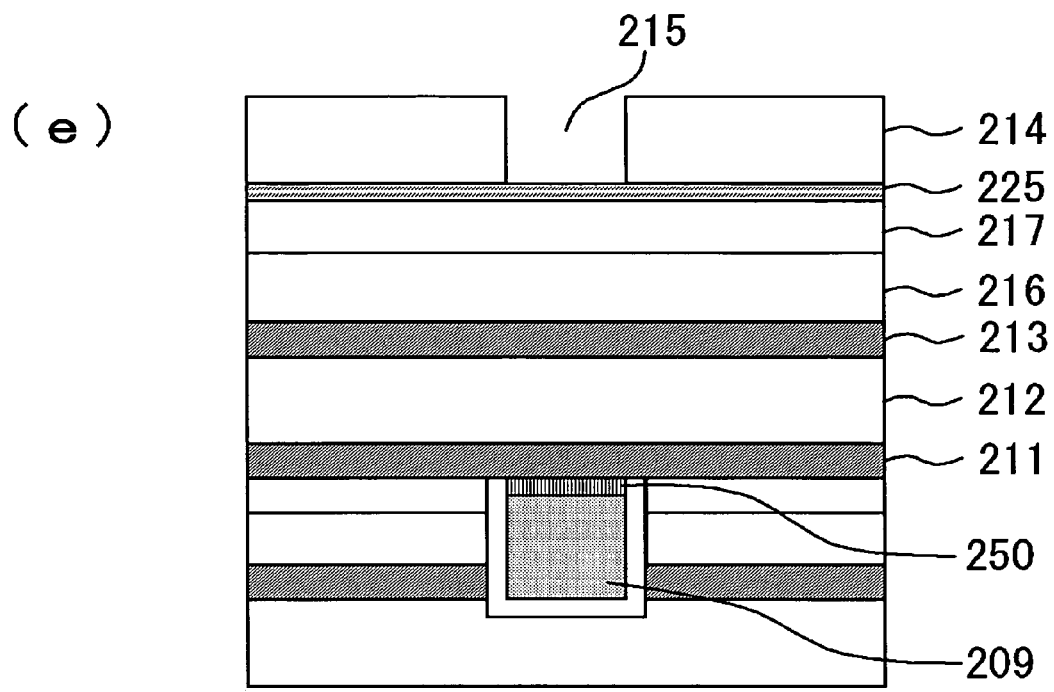
FIGS. 8(*e*) and 8(*f*) are cross sectional views of the semiconductor devices, showing the processing steps of the process for forming the copper interconnect according to the third preferred embodiment of the present invention.
Figure 8:
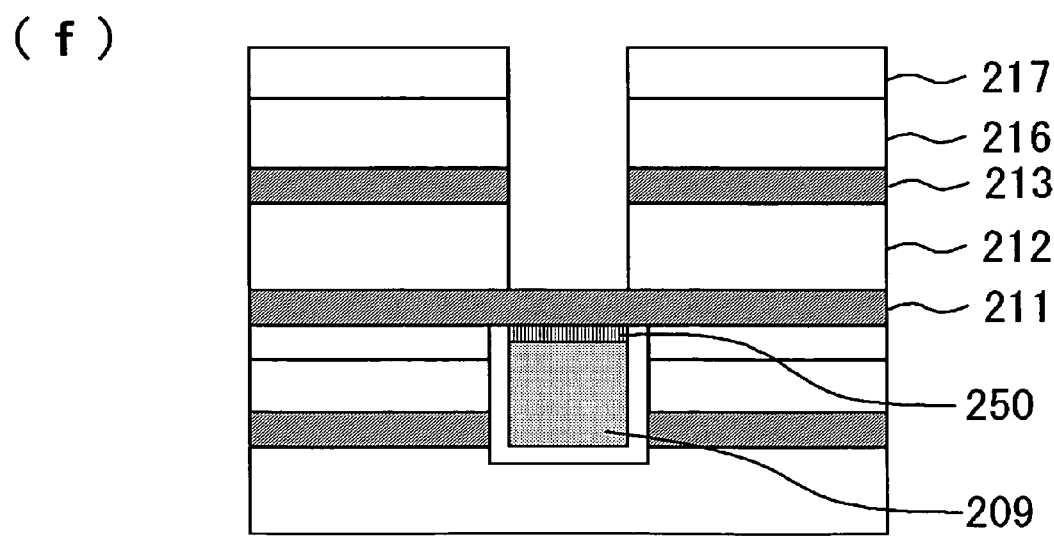

Next, a dry etching processing is carried out by employing the resist pattern 215 for vias to form an opening, which extends to the upper portion of the SiCN film 211 (FIG. 8(f)). Thereafter, an ashing processing and a stripping solution processing are carried out to strip the photo resist 214, the antireflection film 225 and the resist residues.

Figure 9:
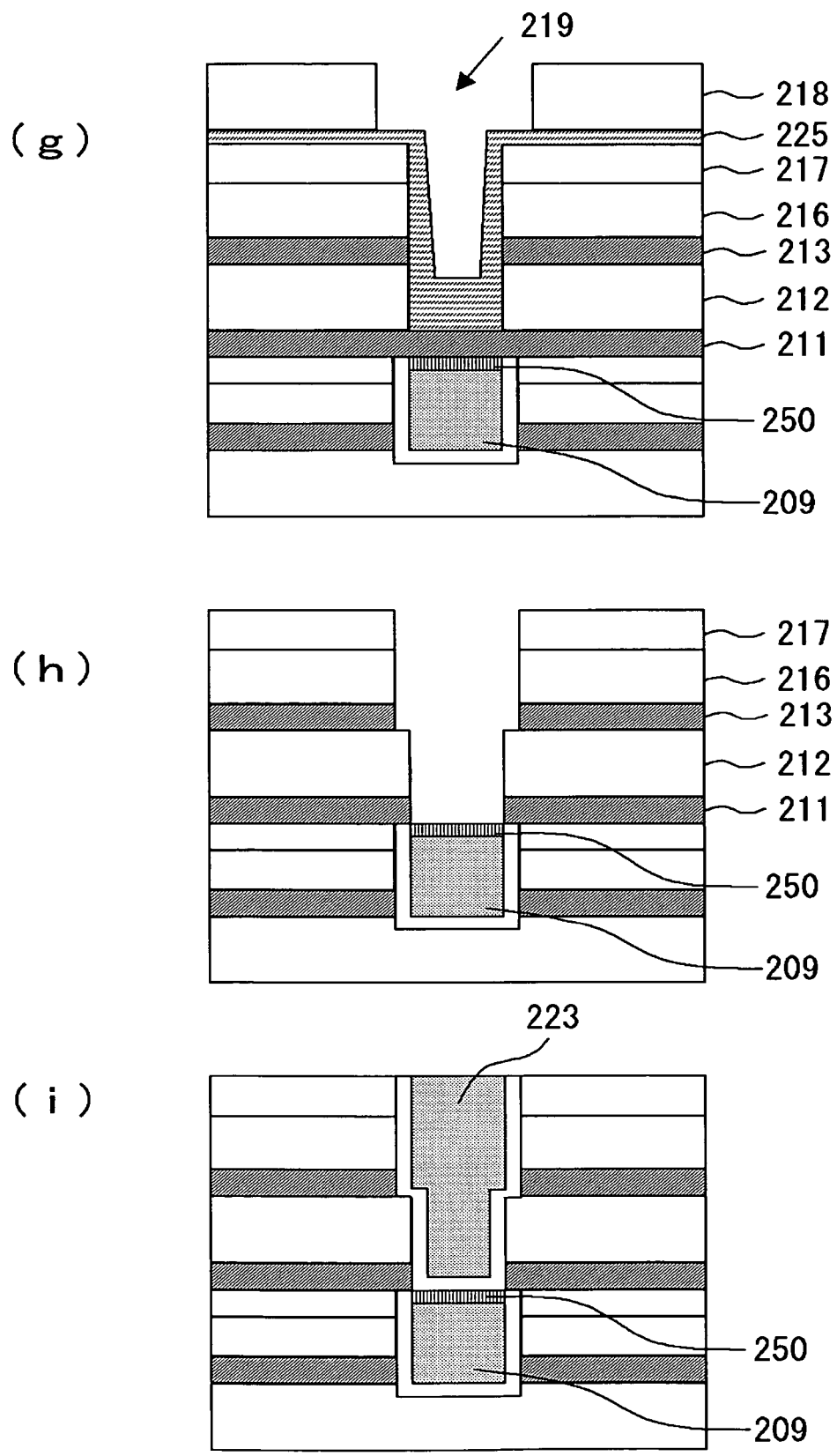
FIGS. 9(*g*) to 9(*i*) are cross sectional views of the semiconductor devices, showing the processing steps of the process for forming the copper interconnect according to the third preferred embodiment of the present invention.
Figure 10:
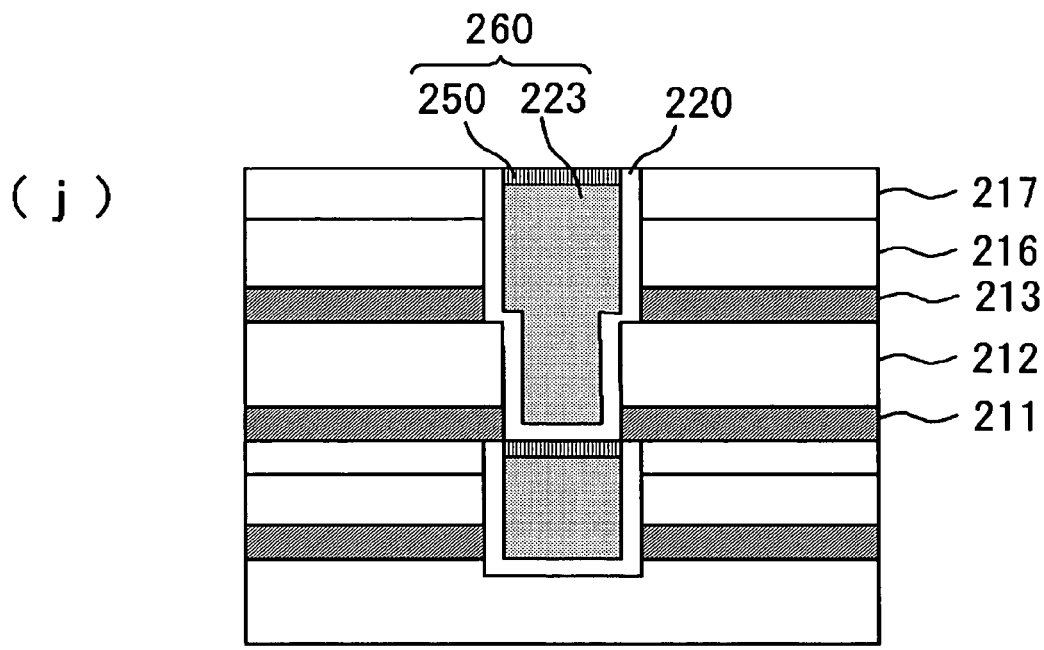
FIGS. 10(*j*) and 10(*k*) are cross sectional views of the semiconductor devices, showing the processing steps of the process for forming the copper interconnect according to the third preferred embodiment of the present invention.
Figure 10:
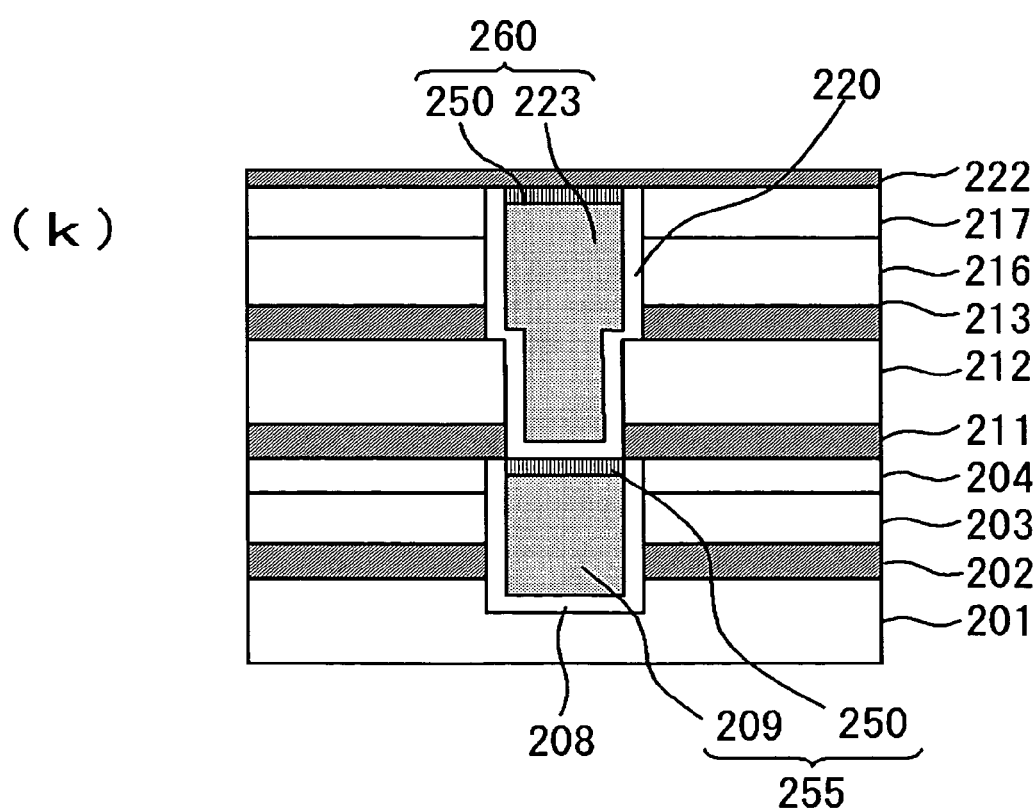

Next, the antireflection film 225 is again applied and baked, and a photo resist 218 is applied thereon, and a resist pattern 219 for the second groove interconnect is formed in the photo resist via the photolithography technique (FIG. 9(g)).

Subsequently, etching is performed through the resist pattern 219 for the second groove interconnect to etch the SiO2 film 217, the L-Ox film 216 and the antireflection film 225 off and the etching is stopped at the SiCN film 213 functioning as the etch stop film. Thereafter, the ashing processing is performed to remove the photo resist 218 for the second groove interconnect and the antireflection film 225, and the SiCN film 211 at the bottom of the via is etched off. Then, the etching residues are removed by using a stripping solution (FIG. 9(h)).

Thereafter, a Cu film is formed to a thickness of 700 nm via the electrolytic plating, and then CMP is performed, and thereafter a copper film 223, which constitutes the upper interconnect and the via plug, is formed, as shown in FIG. 9(i).

Next, similarly as in the formation of the first copper groove interconnect, after performing the treatment with oxalic acid, the rinse with pure water and the anticorrosive treatment with BTA, the BTA layer is removed and the exposure to SiH4 is performed. These processing steps provide a formation of an upper layer interconnect 260 comprising the copper film 223 and the silicon solid solution layer 250 (FIG. 10(j)), and thereafter a SiCN film 222 functioning as a Cu diffusion barrier film is deposited to a thickness of 50 nm to form an interconnect (FIG. 10(k)). In this case, the distribution of the concentration of silicon is that the highest concentration appears on the interconnect surface, and the concentration becomes lower as being closer toward the bottom.

Fourth Preferred Embodiment

This embodiment presents an example, in which the present invention is applied to a dual-layer copper interconnect having a single damascene structure.

Figure 11:
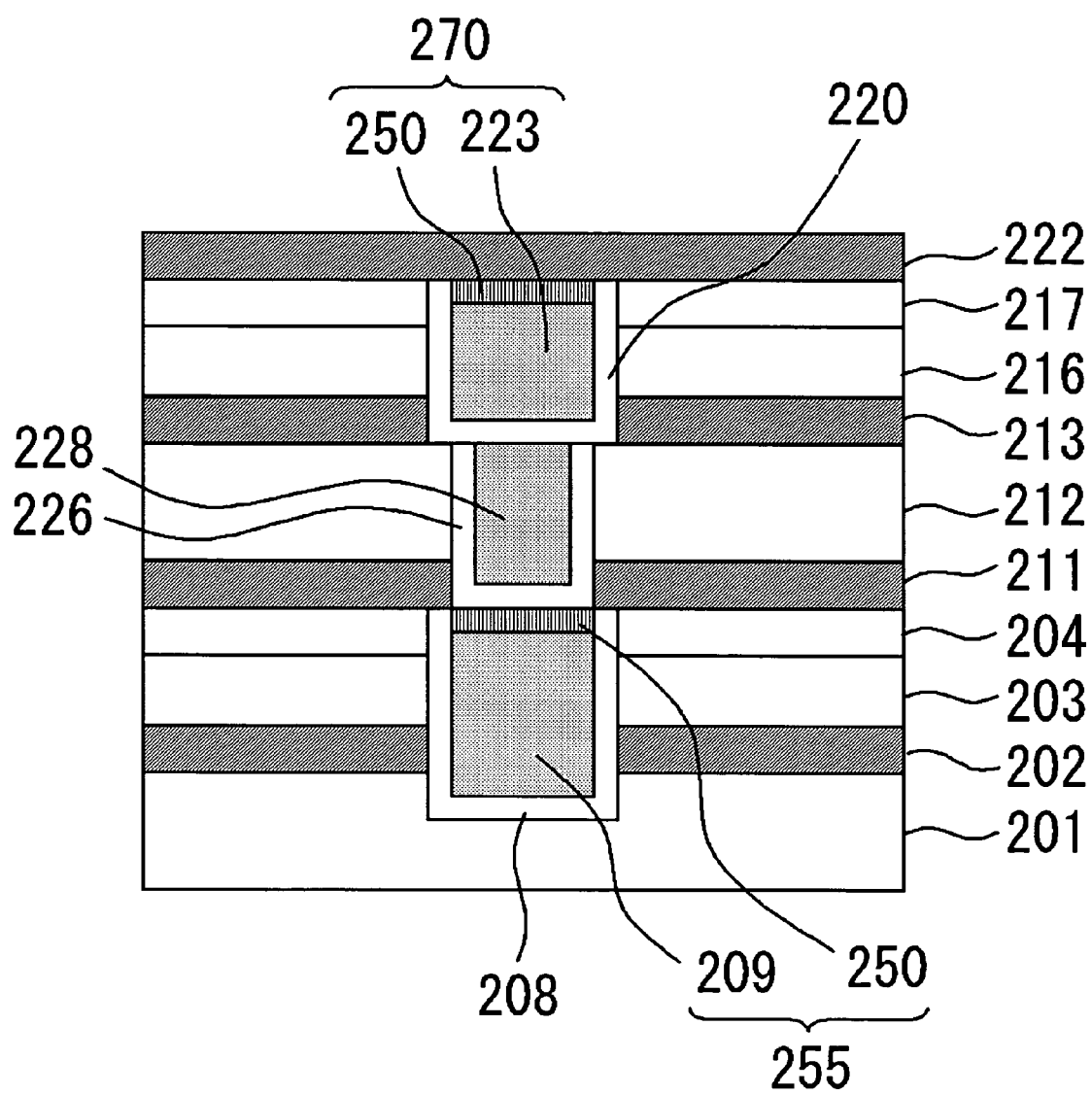
FIG. 11 is a cross sectional view of a semiconductor device according to a fourth preferred embodiment of the present invention.

FIG. 11 is a cross sectional view of a semiconductor device according to a fourth embodiment of the present invention, showing the structure of the semiconductor device. The semiconductor device of this embodiment has a structure, in which an underlying layer interconnect 255 is coupled to an upper layer interconnect 270 via a silicon-containing copper plug 228.

The underlying layer interconnect 255 is disposed within a groove formed in the shown multi-layer films. The groove is formed in the multi-layered films comprising an underlying insulating film 201 deposited on a semiconductor substrate (not shown), a SiCN film 202, a L-Ox film 203 and a SiO2 film 204. Side surfaces and bottom surface of the underlying layer interconnect 255 are covered with Ta/TaN films 208.

The silicon-containing copper plug 228 is disposed in an aperture formed in multi-layer films comprising a SiCN film 211 disposed on the SiO2 film 204 and a SiO2 film 212. Sidewalls and bottom wall of the aperture are covered with Ta/TaN films 226.

An upper layer interconnect 270 is disposed in a groove formed in multi-layer films. The groove is formed in the multi-layer films comprising a SiCN film 213, a L-Ox film 216 and a SiO2 film 217. Sidewalls of the upper layer interconnect 270 is covered with the Ta/TaN films 220, and the upper surface of the upper layer interconnect 270 has a SiCN film 222 formed thereon.

Next, the process for manufacturing the semiconductor device of this embodiment will be described.

FIGS. 12(a) to 12(d) D, FIGS. 13(e) to 13(g), FIGS. 14(h) to 14(j) and FIGS. 15(k) K and 15(l) are cross sectional views of the semiconductor devices, showing the processing steps of the process for manufacturing a semiconductor device according to this embodiment.

In this embodiment, the formation processes until forming the underlying interconnect 255 are performed similarly as in the third embodiment of the present invention. In this case, the distribution of the concentration of silicon is that the highest concentration appears on the interconnect surface, and the concentration becomes lower as being closer toward the bottom.

Figure 12:
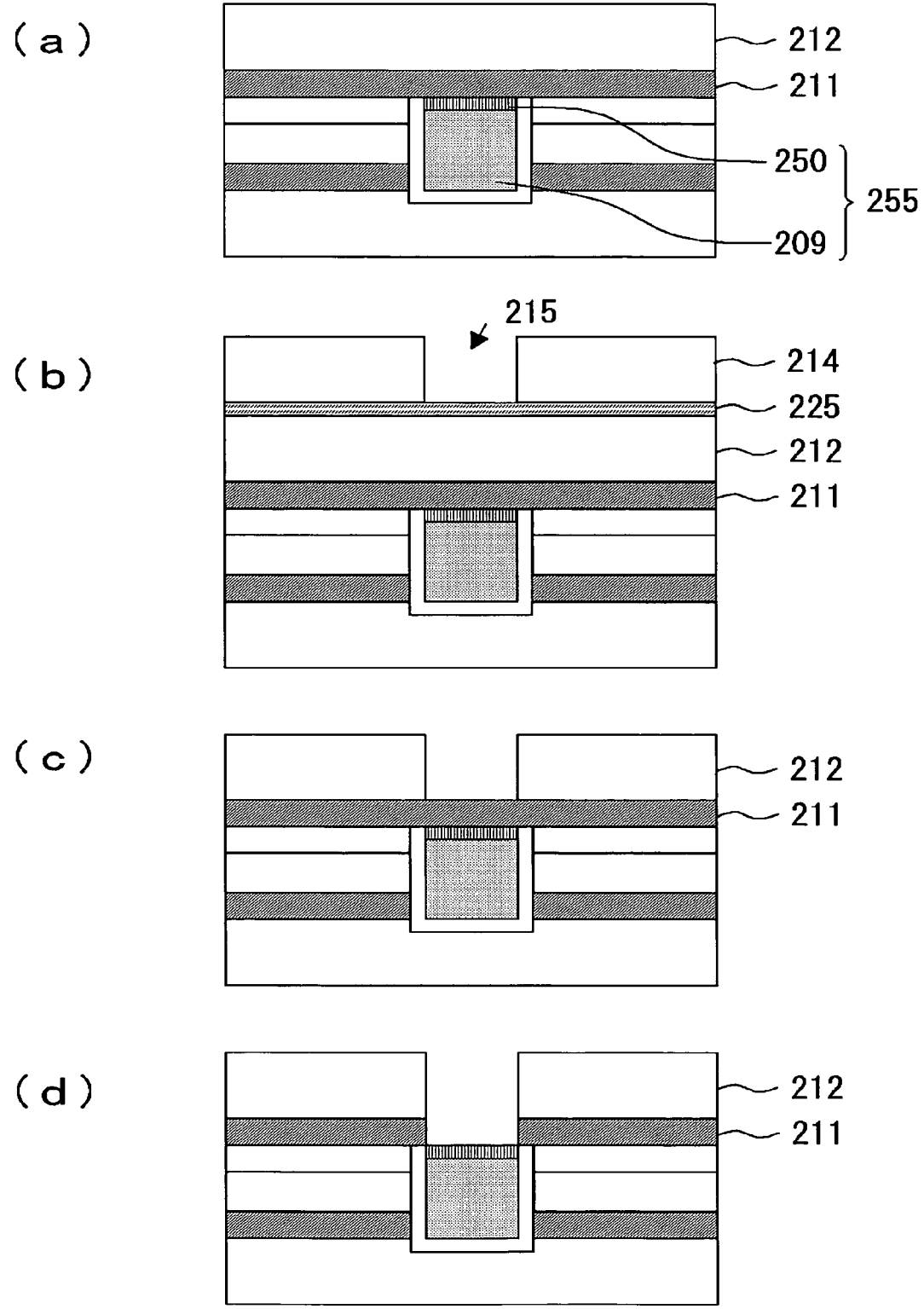
FIGS. 12(a) to 12(d) are cross sectional views of the semiconductor devices, showing the processing steps of the process for forming the copper interconnect according to the fourth preferred embodiment of the present invention.

Next, a SiCN film 211 and a SiO2 film 212 functioning as an inter-layer insulating film are sequentially deposited, similarly as in the third embodiment (FIG. 12(a)).

Next, an antireflection film 225 and a photo resist 214 are applied on the deposited SiO2 film 212, and a resist pattern 215 for vias is formed in the photo resist via a photolithography technique (FIG. 12(b)).

Further, the SiO2 film 212 is etched through the via resist pattern to form the pattern for the via by using a dry etching technique. Thereafter, the ashing processing is performed to remove the photo resist 214 and the antireflection film 225 (FIG. 12(c)). Then, the SiCN film 211 at the bottom of the via is etched back. Then, the etching residues are removed by using a stripping solution (FIG. 12(d)).

Thereafter, Ta/TaN films 226 are deposited to a thickness of 30 nm via a sputtering, and a Cu film (not shown) as a seed film is formed thereon, and after that, a Cu film 227 is formed to a thickness of 700 nm via an electrolytic plating to fill the via pattern. Thereafter, a thermal processing for crystallization thereof is carried out at 400 degree C. (FIG. 13(e)).

Figure 13:
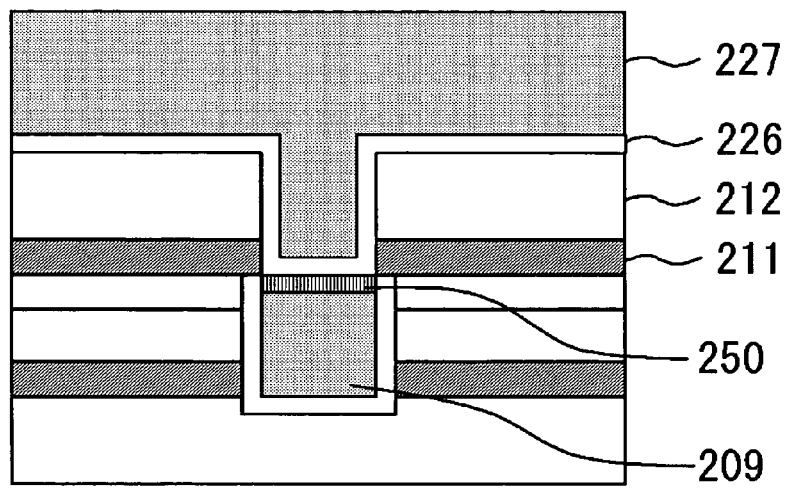
FIGS. 13(e) to 13(g) are cross sectional views of the semiconductor devices, showing the processing steps of the process for forming the copper interconnect according to the fourth preferred embodiment of the present invention.
Figure 13:
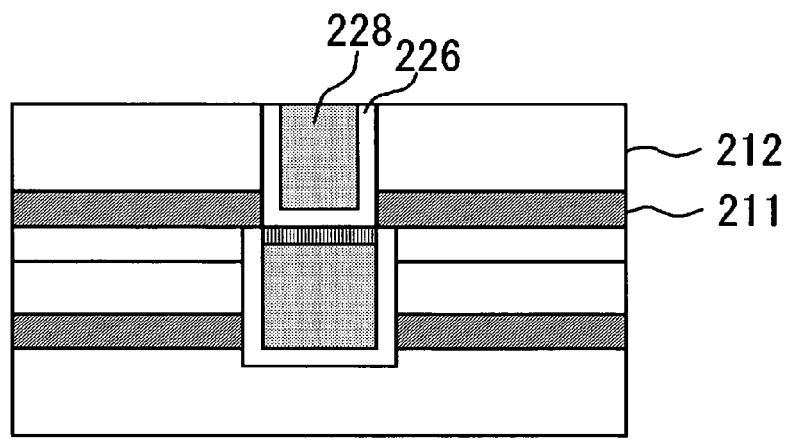
Figure 13:
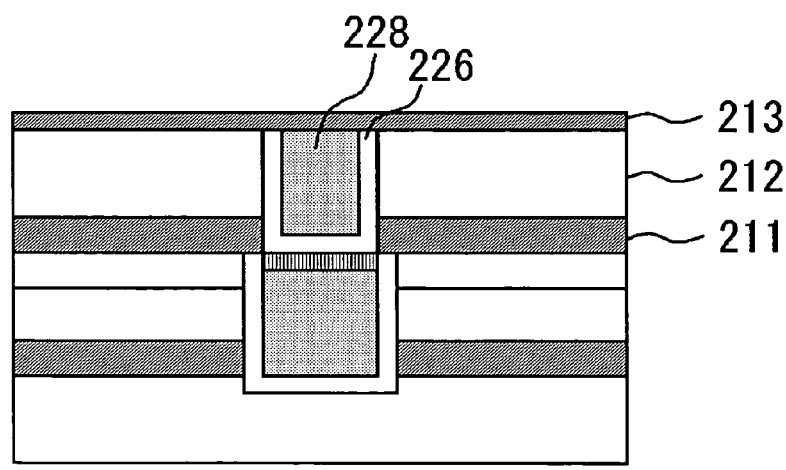
Figure 14:
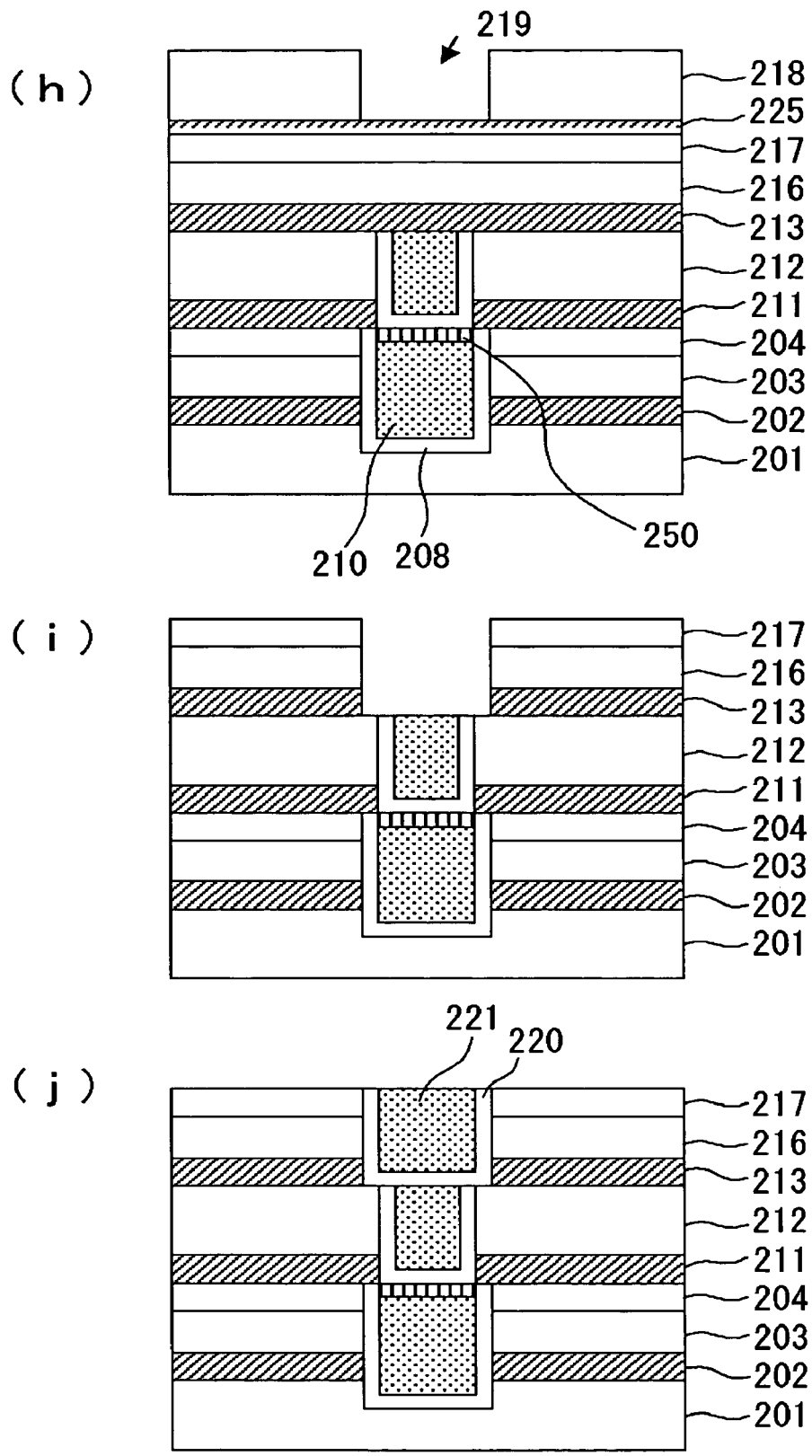
FIGS. 14(h) to 14(j) are cross sectional views of the semiconductor devices, showing the processing steps of the process for forming the copper interconnect according to the fourth preferred embodiment of the present invention.

Next, the Cu film 227 and the Ta/TaN films 226 on the SiO2 film 212 are removed via a CMP, and after performing a treatment with oxalic acid and a rinse with pure water, a surface treatment with BTA solution is carried out to form a copper via plug, in which the Cu surface is antioxidant-treated to form a BTA layer thereon (FIG. 13(f)).

Next, a silicon-containing copper plug 228 is formed by the same processing steps used for forming the underlying layer interconnect 255 in the third embodiment, and a SiCN film 213 functioning as a second Cu diffusion barrier film is formed to a thickness of 50 nm (FIG. 13(g)).

Next, a L-Ox film 216 functioning as a second inter-layer insulating film is spun on thereon to a thickness of 300 nm and baked, and then a SiO2 film 217 is deposited thereon to a thickness of 100 nm. Then, an antireflection film 225 and a photo resist 218 are applied thereon, and a resist pattern 219 for the second groove interconnect is formed in the photo resist 218 via a photolithography technique (FIG. 14(h)).

Next, the SiO2 film 217 functioning as the inter-layer insulating film for the second groove interconnect and the L-Ox film 216 are etched through the mask of the photo resist 218. Then, the photo resist 218 and the antireflection film 225 are removed by an ashing. Then, etching back is carried out for the entire surface to remove the SiCN film 213 functioning as the second Cu diffusion barrier film. Then, the etching residues are removed by using a stripping solution (FIG. 14(i)).

Thereafter, the Ta/TaN films 220 are formed to a thickness of 30 nm via the sputtering, and a Cu film (not shown) as a seed film is formed to a thickness of 100 nm on the Ta/TaN films 220. Then, a Cu film 221 is formed to a thickness of 700 nm via an electrolytic plating, and then the upper interconnect is formed via the CMP. Thereafter, the interconnect surface is cleaned with oxalic acid aqueous solution to remove the oxide layer on the copper surface, and a pure water rinse is performed to remove the remaining oxalic acid and other impurities. Subsequently, the surface of the copper interconnect is treated with BTA aqueous solution. This treatment provides adhesion of BTA, which is an anticorrosive, onto the copper surface (FIG. 14(j)).

Figure 15:
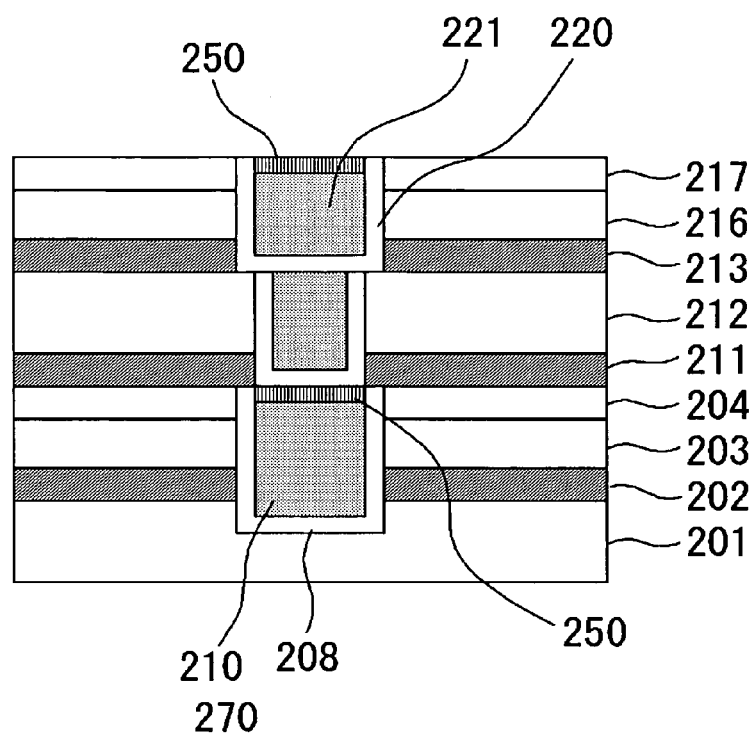
FIGS. 15(k) and 15(l) are cross sectional views of the semiconductor devices, showing the processing steps of the process for manufacturing a semiconductor device according to the fourth preferred embodiment of the present invention.
Figure 15:
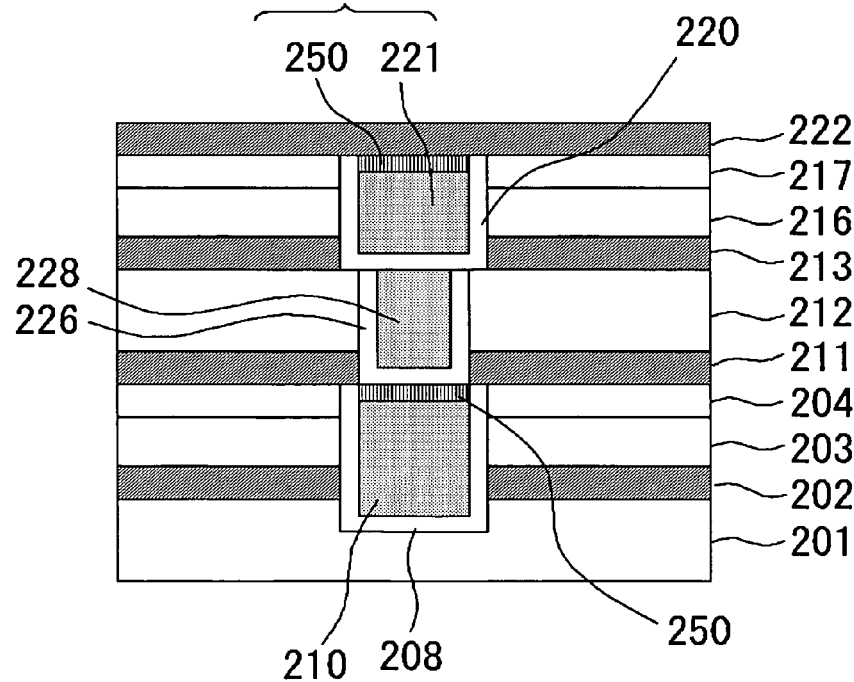

Next, similarly as in the formation process of the underlying layer interconnect 255 and the silicon-containing copper plug 228, BTA layer is removed and the exposure to SiH4 is performed to form an upper layer interconnect 270 (FIG. 15(k)), and a SiCN film 222 functioning as a Cu diffusion barrier film is deposited to a thickness of 50 nm (FIG. 15(l)). The distribution of the concentration of silicon in the upper layer interconnect 270 is controlled so that the highest concentration appears on the interconnect surface, and the concentration becomes lower as being closer toward the bottom.

As described above, the interconnect formed in this embodiment provides an improvement in suppressing the undesired migration of metal particles occurred within the metal interconnect by distributing silicon to the entire interconnect to form the silicon-containing metal interconnect, in comparison with the case in which the silicide layer is formed only on the uppermost surface.

Further, since this embodiment employs the single damascene structure, which comprises the barrier metal interposed between the via and the upper layer interconnect, the further improved stress migration resistance can be obtained.

Although the present invention has been described with referring to the preferred embodiments, it should be noted that these disclosures are for illustration only, and suitable modifications in the configurations and/or the processes thereof may be suitably modified.

For example, in the above-mentioned embodiment, when SiO2 film is used for the inter-layer insulating film, multi-layer films of a L-Ox film and a SiO2 film may be used similarly as in the case of the inter-groove interconnect insulating film. Although the embodiment utilizes the SiO2 film as the mask insulating film for the L-Ox film, other insulating film such as SiC film, SiCN film or SiOC film may be employed provided that the etching selectivity with L-Ox film is excellent and the resistance to the ashing process and the resistance to the wet stripping solution is excellent. Further, although L-Ox film is used for the low dielectric constant inter-layer insulating film, other insulating film having lower relative dielectric constant than the SiO2 film such as SiOF film, SiOC film or organic compound films may be used.

Although the above described embodiments employ the copper interconnect, a copper alloy interconnect including in the interconnect an alloy with at least one of different elements from Cu such as Al, Ag (silver), W (tungsten), Mg (magnesium), Be (beryllium), Zn (zinc), Pc (palladium), Cd (cadmium), Au (gold), Hg (mercury), Pt (platinum), Zr (zirconium), Ti (titanium), Sn (tin), Ni (nickel), Nd (neodymium), Fe (iron) or the like, may be employed.

Further, although the above-described embodiments employ the Ta/TaN films for the barrier metal, the barrier metal may have a structure including at least one of the group consisting of Ti, TiN, TiSiN, Ta, TaN and TaSiN.

Further, although BTA is employed for forming the anti-oxidant film on the interconnect surface, other azole compounds may be employed. Alternatively, BTA derivatives having higher solubility than that of BTA may be employed.

Further, in the fourth embodiment, a silicon solid solution layer may be formed on the surface of the via plug. In this configuration, the surface treatment may be optionally carried out at the processing step represented by FIG. 13(f), and thereafter the exposure to silane may be performed. Above configuration provides further improvements in the stress migration resistance and the electromigration resistance.

EXAMPLE 1

A copper film was formed on a silicon substrate by a plating method, and thereafter an annealing, a treatment with oxalic acid, a rinse with pure water and a treatment with BTA (benzotriazole) were performed. A plurality of copper films processed according to the above-mentioned processes were prepared, and one of the copper films was designated as a sample 1.

Further, a copper film was heated to an elevated temperature of 350 degree C. to 400 degree C. within a vacuum atmosphere to vaporize BTA, and thereafter was exposed to monosilane to obtain a sample 2. The condition for the exposure to monosilane was that the flow rate of SiH4 gas was 10 to 500 sccm, the flow rate of N2 gas 100 to 1,000 sccm, the processing pressure was not higher than 20 Torr and the duration time for the processing was 100 seconds.

On the other hand, a copper film was heated to an elevated temperature of 350 degree C. to 400 degree C. within a vacuum atmosphere to vaporize BTA, and after the processing with ammonia plasma was performed, the copper film was exposed to monosilane to obtain a sample 3. The condition for the ammonia plasma processing was that the flow rate of ammonia was 50 to 500 sccm, RF power was 50 W to 300 W, and the duration time for the processing was 5-30 seconds. The condition for the exposure to monosilane was that the flow rate of SiH4 gas was 10 to 500 sccm, and the duration time for the processing was 100 seconds.

Figure 16:
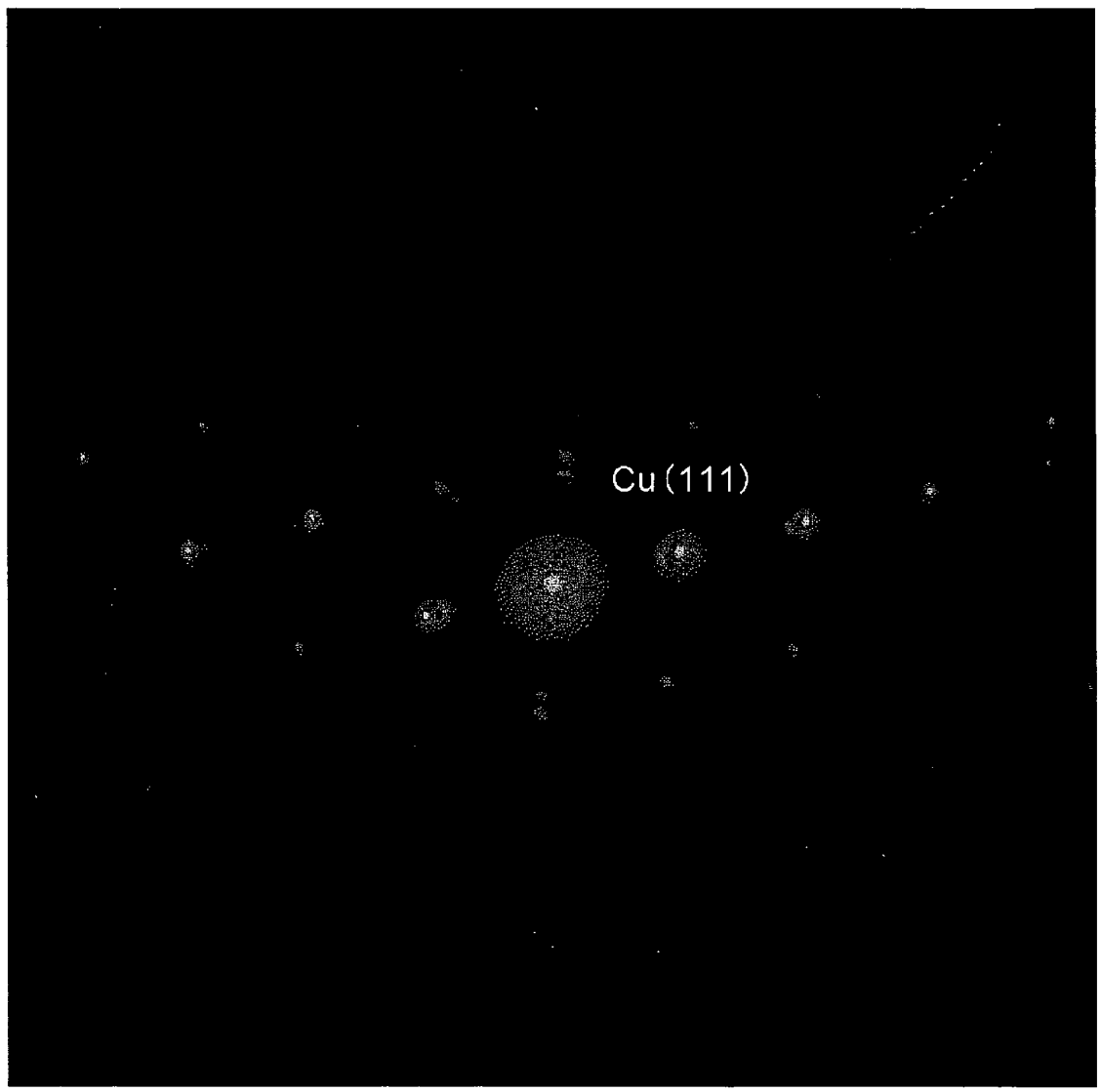
FIG. 16 is an electron beam diffraction image of copper.
Figure 17:
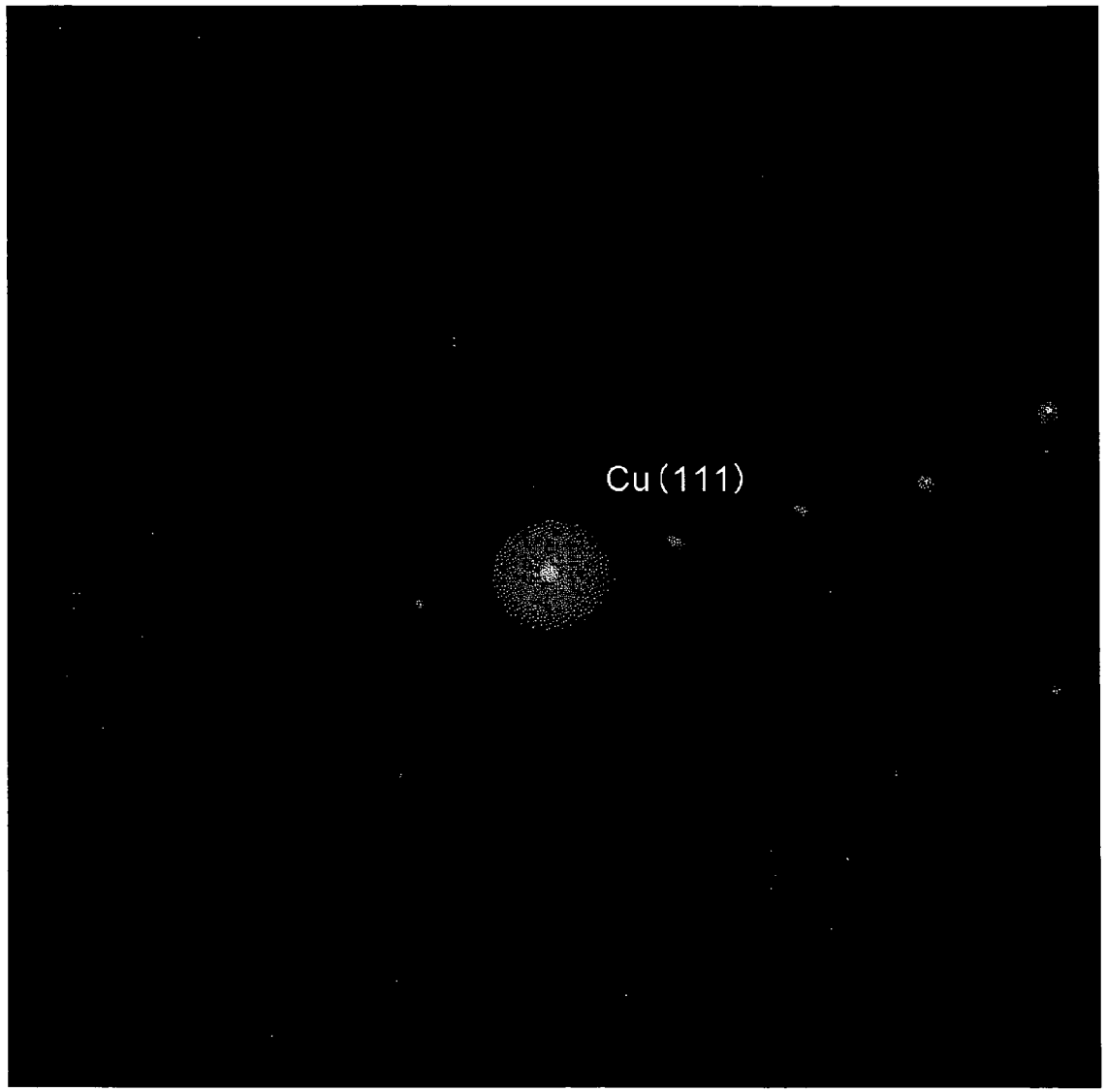
FIG. 17 is an electron beam diffraction image of silicon solid solution layer.
Figure 18:
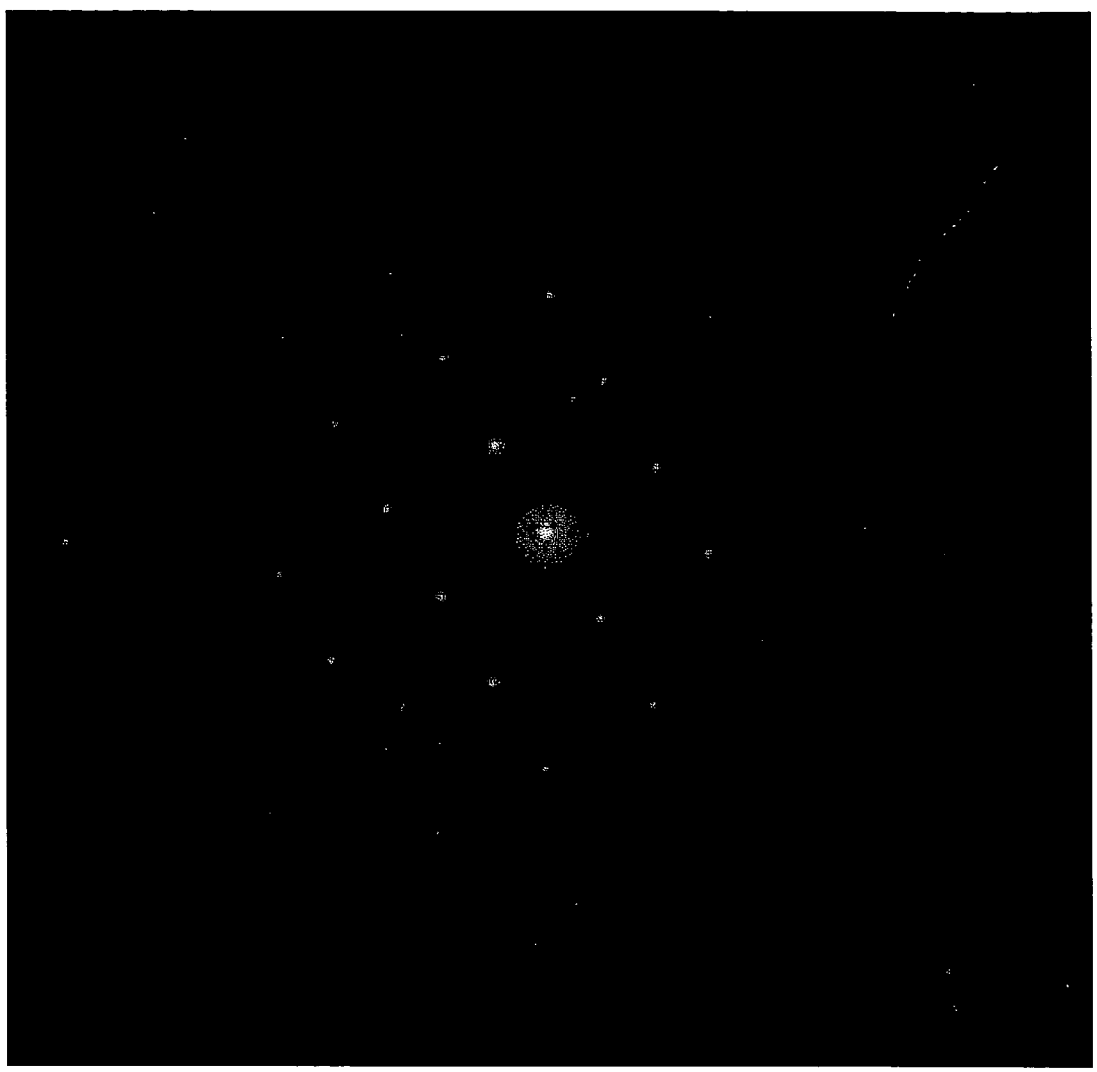
FIG. 18 is an electron beam diffraction image of copper silicide.

Electron beam diffraction analyses of the obtained samples were carried out. FIGS. 16, 17 and 18 correspond to samples 1, 2 and 3, respectively, and the samples 1, 2 and 3 were identified to: copper; silicon-containing copper (silicon solid solution); and copper silicide, respectively, according to the lattice constant and so on. The conditions for the analysis were set as follows.

TEM observation: electron beam accelerating voltage is 200 kV,

Electron beam diffraction: electron beam accelerating voltage is 200 kV, electron beam probe diameter is approximately 3 nm, EDX analysis: electron beam accelerating voltage is 200 kV, and electron beam probe diameter during the STEM-EDX analysis is approximately 1 nm.

According to the results shown in FIGS. 16 to 18, it is found that the sample 2 has the same lattice constant and the same crystal structure as the sample 1 (pure copper) has. On the other hand, it is also found that the sample 3 has the different lattice constant and the different crystal structure therefrom. The results of the analysis on the crystal structure are shown below.

Samples 1 and 2: Cu and silicon-containing copper, cubic crystal (face-centered cubic structure), lattice constant a=3.6 angstrom;

Sample 3: Cu5Si, cubic crystal (beta —Mn structure), lattice constant a=6.2 angstrom.

EXAMPLE 2

Figure 19:
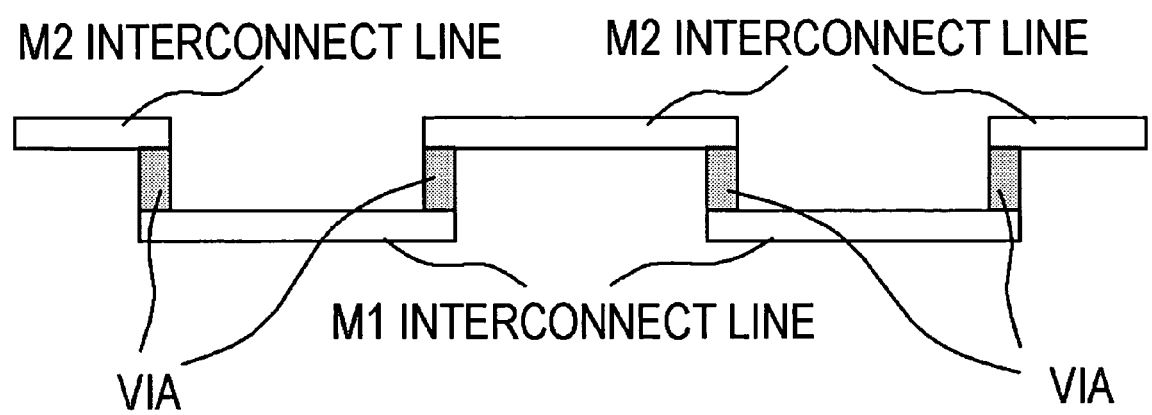
FIG. 19 is a cross sectional view of the via chain, showing the dual-layer interconnect employed in the example.

In this example, dual-layer copper interconnect structures comprising an underlying M1 interconnect and an upper M2 interconnect coupled to the M1 interconnect line through a via as shown in FIG. 19 were manufactured, and process yield tests were performed. The following two samples of the interconnect structures were prepared and evaluated.

Sample (i): an interconnect structure prepared by a method similar to the method of the above described second preferred embodiment. Surfaces of the underlying M1 interconnect and the upper M2 interconnect were treated in accordance with a method similar to that used for treating the sample 2 in the Example 1.

Sample (ii): an interconnect structure prepared by a method generally similar to the method of the above described second preferred embodiment, except that the conditions for the exposure to silane and the conditions for the treatment with oxalic acid and the subsequent rinse processing and so on are modified to form copper silicide. Surfaces of the underlying M1 interconnect and the upper M2 interconnect were treated in accordance with a method similar to that used for treating the sample 3 in the Example 1.

The crystal structures of the surfaces of the interconnects obtained by the above described treatments were evaluated by the electron beam diffraction, and the sample (i) was identified as silicon solid solution, and the sample (ii) was identified as copper silicide.

Figure 20:
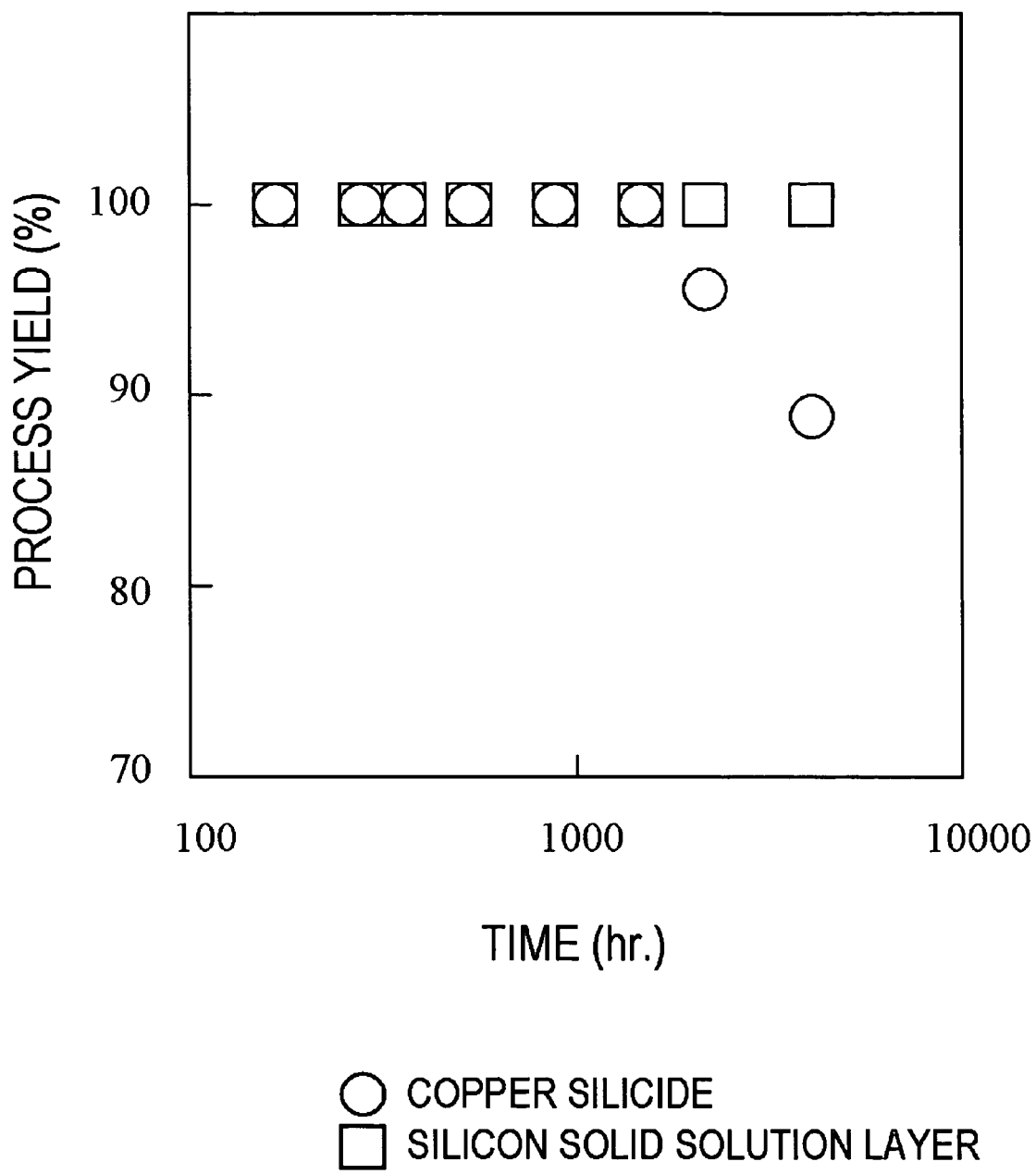
FIG. 20 is a graph showing the results of improvements in the stress migration resistance according to the example.

The dual-layer interconnect structure is referred to as a via chain, and comprises 500,000 vias and interconnects disposed on both the top and the bottom thereof. The interconnects and the vias are made of copper. Electrical resistance of this interconnect structure comprising the interconnects and the vias is measured by applying an electrical voltage between the both ends of the via chain. This resistance is referred to as chain resistance. The chain resistance is an effective index for determining the via coupling conditions. In this example, the above-mentioned via chains were formed on the respective chips disposed on the silicon wafer, and the resistances of the respective via chains were measured. The acceptance criteria of the measured resistances were defined that the measured resistance of not higher than a reference value was "acceptable", and the measured resistance of higher than the reference value was "not acceptable". The rate of the "acceptable" chips in the whole chips was defined as a via process yield The results of the measurements are shown in FIG. 20. The devices prepared by the method described in the second preferred embodiment has improved process yield in comparison with that having copper silicide formed therein.

EXAMPLE 3

Figure 21:
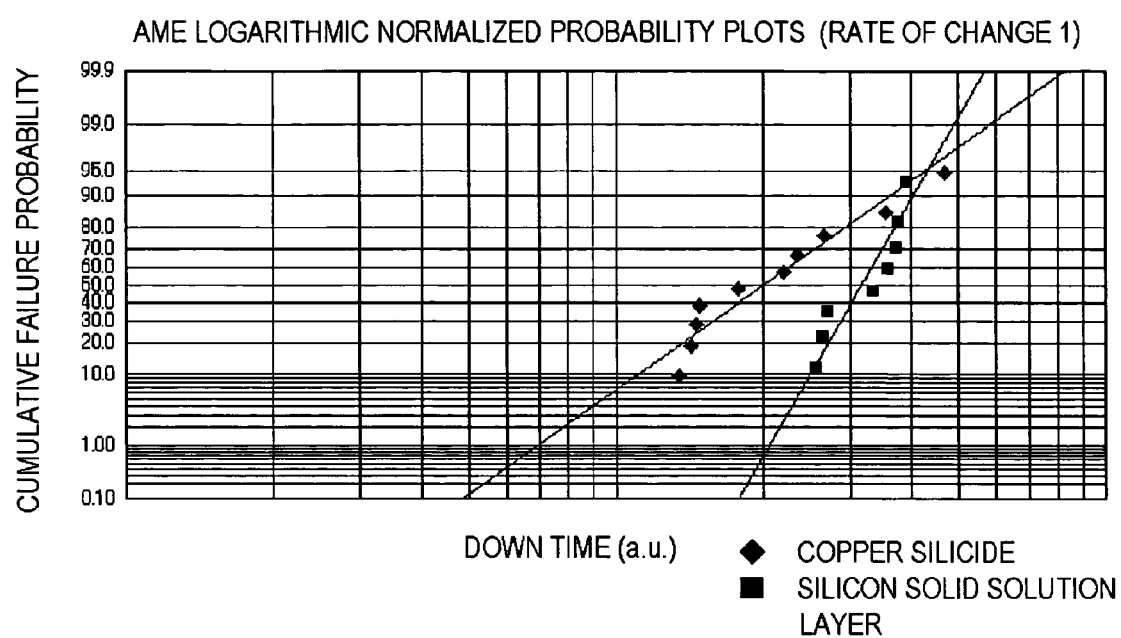
FIG. 21 is a logarithmic graph showing the results of improvements in the electromigration resistance according to the example.

FIG. 21 is a graph showing the results of the evaluation for the process yield of the via chain having the dual-layer interconnect structure. It was found that the sample (i), in which copper is solid-solute within copper, exhibited the better process yield than that of the silicide copper interconnect.

As described above, the present invention provides the semiconductor device comprising the metal interconnect, which exhibit the considerably improved electromigration resistance and/or stress migration resistance. Therefore, the semiconductor device having improved device lifetime is obtainable by having the configurations of the present invention.

What is claimed is:

1. A semiconductor device comprising:
   a semiconductor substrate;
   an insulating film formed on said semiconductor substrate; and
   a metal interconnect embedded in said insulating film,
   wherein said metal interconnect comprises:
      a base layer; and
      an upper layer including atoms of a solid solution element disposed above said base layer,
   wherein said upper layer is disposed at a first side of said metal interconnect that is opposite to a second side of said interconnect which is proximate to the semiconductor substrate,
   wherein said metal interconnect comprises a first region where a via is provided and a second region where said via is not provided, and said solid solution element exists at said first regions and said second region,
   wherein said semiconductor device further comprises a barrier metal film formed on said first side of said metal interconnect and said second side of said metal interconnect,
   wherein said base layer includes atoms of said solid solution element, and
   wherein a concentration of said atoms of said solid solution element in said base layer is lower than a concentration of said atoms of said solid solution element in said upper layer.

2. The semiconductor device according to claim 1, wherein a metal constituting said metal interconnect comprises at least one of copper and an alloy containing copper.

3. The semiconductor device according to claim 1, wherein an atomic radius of said atom of solid solution element is equal to or less than approximately 1.4 angstroms.

4. The semiconductor device according to claim 1, wherein said solid solution element comprises silicon.

5. The semiconductor device according to claim 1, wherein a region where said atoms of solid solution element are introduced forms a solid solution layer in a vicinity of said first side surface of said metal interconnect.

6. The semiconductor device according to claim 5, wherein a concentration of said solid solution element in said solid solution layer is within a range from approximately 0.1 atomic % to approximately 9 atomic %.

7. The semiconductor device according to claim 5, wherein a concentration of said solid solution element in a region of said metal interconnect other than said solid solution layer is less than approximately 0.1 atomic %.

8. The semiconductor device according to claim 5, wherein a thickness of said solid solution layer is equal to or less than approximately 40% of a thickness of said metal interconnect.

9. The semiconductor device according to claim 1, further comprising a film containing SiC, SiN, SiON or SiOC on the said first side of said metal interconnect.

10. The semiconductor device according to claim 1, wherein said metal interconnect comprises a silicon solid solution layer comprising said atoms of solid solution silicon.

11. The semiconductor device according to claim 10, wherein said silicon solid solution layer comprises a crystal lattice structure of copper having inter-lattice point silicon atoms.

12. The semiconductor device according to claim 10, wherein said silicon solid solution layer is disposed between a lower silicon concentration region and a diffusion barrier film.

13. The semiconductor device according to claim 1, wherein said metal interconnect comprises:
   a lower silicon concentration region; and
   a silicon solid solution layer comprising said atoms of solid solution silicon.

14. The semiconductor according to claim 1, wherein said upper layer comprises a structure in which silicon atoms are introduced with a crystal lattice structure of copper that constitutes die metal interconnect to be disposed within the lattice as inter-lattice point atoms.

15. The semiconductor according to claim 1, wherein said base layer comprises copper, and
   wherein said solid solution element comprises silicon.

* * * * *